(12) United States Patent
Nagai

(10) Patent No.: US 6,392,937 B2
(45) Date of Patent: *May 21, 2002

(54) REDUNDANCY CIRCUIT OF SEMICONDUCTOR MEMORY

(75) Inventor: Takeshi Nagai, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/861,843

(22) Filed: May 22, 2001

Related U.S. Application Data

(63) Continuation of application No. 09/527,514, filed on Mar. 16, 2000.

(30) Foreign Application Priority Data

Mar. 18, 1999 (JP) .......................................... 11-074040

(51) Int. Cl.[7] .................................................. G11C 7/00
(52) U.S. Cl. .................................. 365/200; 365/230.03
(58) Field of Search .......................... 365/200, 230.03, 365/189.01, 230.01

(56) References Cited

U.S. PATENT DOCUMENTS

| | | |
|---|---|---|
| 5,469,388 A | 11/1995 | Park |
| 5,528,539 A | 6/1996 | Ong et al. |
| 5,612,918 A | 3/1997 | McClure |
| 5,684,746 A | 11/1997 | Oowaki et al. |
| 5,703,817 A | 12/1997 | Shiratake et al. |
| 6,188,618 B1 | 2/2001 | Takase |

FOREIGN PATENT DOCUMENTS

| | | |
|---|---|---|
| JP | 7-176200 | 7/1995 |
| JP | 10-27499 | 1/1998 |

OTHER PUBLICATIONS

S. Takase et al., "A 1.6GB/s DRAM with Flexible Mapping Redundancy Technique and Additional Refresh Scheme," 1999 IEEE ISSCC, Digest of Technical Papers, pp. 410–411.

*Primary Examiner*—Hoai V. Ho
(74) *Attorney, Agent, or Firm*—Banner & Witcoff, Ltd.

(57) ABSTRACT

A semiconductor has eight banks that can be accessed simultaneously. Within each bank, there are disposed two fixed spare row decoders and two mapping spare row decoders. Within each bank, two fixed fuse sets are provided corresponding to the fixed spare row decoders. Eight mapping fuse sets are provided at the outside of each bank, for example, with no association with the mapping spare row decoders. Each mapping fuse set stores mapping data for determining a correspondence of the mapping fuse set to a specific mapping spare row decoder within a specific bank.

26 Claims, 15 Drawing Sheets

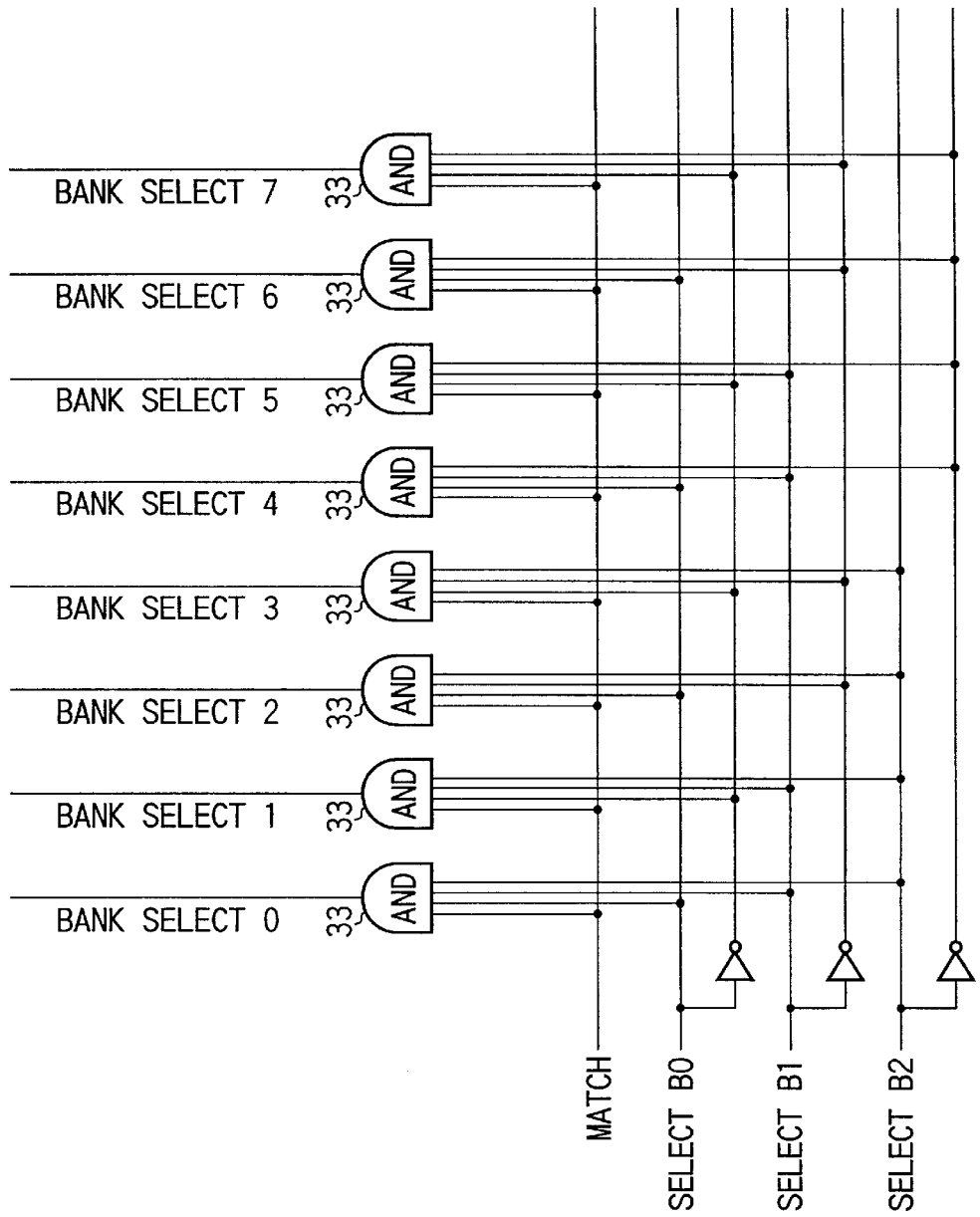

REDUNDANCY CIRCUIT OF SEMICONDUCTOR MEMORY

CROSS-REFERENCE TO RELATED APPLICATION

This application is a continuation of prior application Ser. No. 09/527,514, filed Mar. 16, 2000.

This application is based upon and claims the benefit of priority from the prior Japanese Patent Application No. 11-074040, filed Mar. 18, 1999, the entire contents of which are incorporated herein by reference.

BACKGROUND OF THE INVENTION

The present invention relates to a semiconductor memory including a redundancy circuit for relieving a defective memory cell.

In general, a semiconductor memory has a redundancy circuit for improving the yield of a product. When a defective memory cell exists within a memory cell array (a normal cell array), the redundancy circuit has a function of replacing this defective memory cell with a redundancy memory cell within a spare memory cell array.

At present, it is most general that a redundancy circuit employs a system of replacing a defective memory cell with a redundancy memory cell in a relief unit (replacement unit). The relief unit is a set of memory cells that are replaced at the same time when a defective memory cell is replaced with a redundancy memory cell. Generally, the relief unit is set in either memory cells that are connected to one or a plurality of word lines (row unit), or in memory cells that are connected to one or a plurality of pairs of bit lines (column unit).

When memory cells connected to a plurality of word lines (a plurality of rows) are set as a relief unit, for example, these plurality of word lines are connected to one row decoder, and a defective memory cell is replaced with a redundancy memory cell in a row decoder unit. Further, when memory cells connected to a plurality of pairs of bit lines (a plurality of columns) are set as a relief unit, for example, the plurality of pairs of bit lines are connected to one pair of I/O (Input/Output) lines, and a defective memory cell is replaced with a redundancy memory cell in a unit of the pair of I/O lines.

Further, in the case of a semiconductor memory structured by a plurality of banks that can be accessed substantially simultaneously, one bank (a memory cell array having a constant memory capacity) is set as a relief block unit. The relief block unit is a range in which a replacement in relief unit is effective. In other words, in this case, a defective memory cell is replaced with a redundancy memory cell in each relief unit within one relief block unit. More specifically, a defective memory cell within one bank can be replaced with only a redundancy memory cell within this bank, and the defective memory cell cannot be replaced with a redundancy memory cell within other banks.

In order to replace a defective memory cell with a redundancy memory cell in each relief unit, it is necessary to register in advance an address (a fail address) for specifying a relief unit having a defective memory cell in an address registration memory (for example, a fuse set). Further, it is also necessary to make a decision as to whether or not an external address or an internal address coincides with this fail address at the time of operating the semiconductor memory.

Accordingly, each of the plurality of banks within the semiconductor memory (a memory chip) has address registration memories (fail address memories) by the number equal to that of the relief units. The fail address memories are structured by nonvolatile memories. At present, a fuse is mainly used for the nonvolatile memory. A fail address memory structured by this fuse is called a fuse set.

Relief units and fuse sets are disposed at a ratio of one to one within one bank. In other words, the number of fuse sets within one bank is equal to the number of relief units in this bank.

A fuse set includes a plurality of fuse elements for storing fail addresses. One fuse element can store one bit data depending on whether this fuse element is to be disconnected or not. Accordingly, an N-bit fail address can be stored in N fuse elements.

A structure of the fuse set is simple, and the system for storing fail addresses in a fuse set is most widely employed at present.

FIG. 1 shows a main portion of a semiconductor memory having fuse sets.

In the present example, the semiconductor memory has a plurality of banks that can be accessed substantially simultaneously. One bank forms a relief block unit and one row decoder forms a relief unit.

A memory cell array is structured by eight sub-arrays 10. One sub-array 10 is disposed within one bank BANKi (i=0, 1, . . . 7). In this case, eight banks BANK0, BANK1, . . . BANK7 are adjacently disposed in a column direction, for example. Each BANKi (i=0, 1, . . . 7) includes a normal cell array 11, a spare cell array 12, a row decoder 13, a fixed spare row decoder 14, and a fixed fuse set 15.

The normal cell array 11 has a memory capacity of 512 kilobits, for example. On the normal cell array 11, there are disposed 512 word lines 16 and 1,024 pairs of bit lines. In the present example, the number of the row decoders 13 is set to 128, and four word lines 16 are connected to one row decoder.

The spare cell array 12 has a memory capacity of sixteen kilobits, for example. On the spare memory cell array 12, there are disposed sixteen spare word lines 17 and 1,024 pairs of bit lines. The number of the fixed spare row decoders 14 is set to four. The four spare word lines 17 are connected to one fixed spare row decoder.

A column decoder 19 is disposed adjacent to the bank BANK7 positioned at the last end of the eight banks BANK0, BANK1, . . . BANK7. A column select line CSL 18 is common to the eight banks BANK0, BANK1, . . . BANK7, and is disposed above the eight banks BANK0, BANK1, . . . BANK7. The column select line 18 extends to the BANK0 side from the column decoder 19.

In the present example, one bank is set as a relief block unit, one row decoder (four word lines) is set as a relief unit, and four fixed spare row decoders are disposed within one bank. Therefore, it is possible to replace maximum four row decoders with fixed spare row decoders within one bank.

In other words, when a defective memory cell is included within the normal cell array 11, and also when four or less row decoders out of the 128 row decoders are connected to the defective memory cell, it is possible to replace these defective row decoders with the fixed spare row decoders. As a result, a fraction of defective semiconductor memories can be decreased, and the yield of the products (productivity) can be improved.

Within each bank BANKi (i=0, 1, . . . 7), four fixed fuse sets 15 are provided corresponding to four fixed spare row decoders 14. Each fixed fuse set can store one fail address.

An input address (an external address or an internal address) is input to each fixed fuse set. When the input addresses disagree with the fail addresses in all the fixed fuse sets, for example, the row decoders 13 become active (DISABLE F="1"), and all the fixed spare row decoders 14 become inactive.

Further, when the input address coincides with the fail address in at least one of the fixed fuse sets, the row decoder 13 becomes inactive (DISABLE F="0"), and the fixed spare row decoder corresponding to the at least one of the fixed fuse sets becomes active.

FIG. 2 shows an example of a fixed fuse set within a bank.

In the present example, the four fixed spare row decoders in FIG. 1 correspond to the four fixed fuse sets 15. Accordingly, when the semiconductor memory is structured by eight banks as shown in the example of FIG. 1, the fixed spare row decoders and the fixed fuse sets are provided by thirty-two (=4×8) within the semiconductor memory (memory chip).

When there exist 128 (=$2^7$) row decoders within one bank as shown in the example of FIG. 1, seven-bit address signals A0, A1, ... A6 are necessary in order to specify one of the 128 row decoders. Therefore, in order to store a fail address, at least seven fuse units (fuse elements) 20 are necessary.

In the present example, one fuse unit (fuse element) 20' is provided as an enable fuse unit for determining whether the fixed fuse set 15 is to be used or not. Accordingly, within one fixed fuse set 15F, the fuse units 20 and 20' are provided by eight in total.

One fuse unit is structured by a p-channel MOS transistor Qp, an n-channel MOS transistor Qn, and a fuse element FUSE, as shown in FIG. 3. An output signal of the fuse unit is "1" when the fuse element FUSE is being disconnected, and is "0" when the fuse element FUSE is not being disconnected.

Output signals of the seven fuse units 20 for storing a fail address are input to comparators 22 within a fail address coincidence detector 21. The comparators 22 compare the row addresses A0, A1, ... A6 with the output signals (fail addresses) of the fuse units 20 respectively. The comparators 22 are structured by exclusive NOR circuits, for example. They output "1" when the input addresses coincide with the fail addresses.

Output signals of the comparators 22 and an output signal of the fuse unit 20' are input to an AND circuit (a fail address coincidence detector) 23. The output signal of the fuse unit (enable fuse) 20' is set to "1" when the fixed fuse set 15 including this fuse unit 20' is used. The output signal of the fuse unit (enable fuse) 20' is being set to "0" when the fixed fuse set 15 including this fuse unit 20' is not used.

Accordingly, when the fixed fuse set 15 is used and also when the input address coincides with the fail address, the output signal of the AND circuit (fail address coincidence detector) 23 becomes "1", so that the fixed spare row decoder is activated. In this case, an output signal DISABLE F of an NOR circuit 24 becomes "0", and the row decoder is inactivated. When all the outputs of the four fixed fuse sets 15 are "0", the output signal DISABLE F of the NOR circuit 24 becomes "1", so that the row decoder is activated.

FIG. 4 shows an example of sub-arrays within a bank and their surroundings.

A sense amplifier 25 and a column select switch 26 are disposed within each bank. A pair of bit lines BL and bBL are connected to the sense amplifier 25. In the present example, the pair of bit lines BL and bBL are connected to only one side of the sense amplifier 25. However, the pair of bit lines BL and bBL can also be connected to both sides of the sense amplifier 25.

Memory cells MC are connected to each word line WL, and spare cells (redundancy memory cells) SC are connected to each spare word line SWL. The pair of bit lines BL and bBL are connected to a pair of data lines (a pair of DQ lines) DQ and bDQ through the sense amplifier 25 and the column select switch 26.

The column select lines CSL are connected to the column select switches 26, and the column select lines CSL are provided in common to the plurality of banks as shown by a reference number 18 in FIG. 1. Column address signals are decoded by column decoders, and decoded results are transmitted to the column select switches 26 through the column select lines CSL.

Next, a relationship between the number of fixed fuse sets (fuse elements) within the semiconductor memory (memory chip) and the number of relief units that can be relieved by the fixed fuse sets will be examined.

In the present example, there will be explained about a semiconductor memory having a plurality of banks that can be accessed substantially simultaneously. It is assumed that one bank forms a relief block unit and that $2^M$ (M is a natural number) relief block units are disposed within one semiconductor memory. Further, it is also assumed that $2^N$ relief units (for example, row decoders) assigned by N-bit addresses (N is a natural number) are disposed within one relief block unit and that S (S is a natural number) redundancy relief units (for example, fixed spare row decoders) are disposed within one relief block unit.

The number of fuses within one relief block unit will be examined.

When one of the $2^N$ relief units is a fail, for example, it is necessary to replace this one fail relief unit with one of the S redundancy relief units. The number of fuses necessary for specifying this replacement becomes (N+1) which is a total of one enable fuse for determining whether a fuse set is to be used or not and N fuses for storing the N-bit addresses (fail addresses).

Accordingly, (N+1) fuses are disposed within one fuse set for storing the redundancy replacement data.

Further, as the redundancy relief units exist by S, it is necessary to provide S fuse sets corresponding to these redundancy relief units. As a result, (N+1)×S fuses in total are disposed within one relief block unit.

Further, as the relief block units are disposed by $2^M$ within the semiconductor memory (chip memory), redundancy fuses are provided by (N+1)×S×$2^M$ in total within the semiconductor memory.

In the semiconductor memory having the above-described structure, it is possible to replace at least one defective memory cell within each one of the S relief units within one relief block unit. In other words, when the number of the relief units including a defective memory cell is not more than S within one relief block unit, it is possible to relieve the semiconductor memory. On the other hand, when the number of the relief units including a defective memory cell exceeds S, it is not possible to relieve the semiconductor memory.

Accordingly, in a semiconductor memory (memory chip), it is possible to replace defective memory cells with redundancy memory cells by using a redundancy circuit, when the number of the relief units including the defective memory cells is not more than S×$2^M$. However, within one relief block unit, the number of the relief units including the defective memory cells needs to be S or less.

The above can be summarized as follows.
(1) Total number of redundancy fuses within the chip: $(N+1) \times S \times 2^M$
(2) Total number of redundancy relief units within the chip: $S \times 2^M$
(3) Total number of fuse sets within the chip $S \times 2^M$
(4) Total number of relief units that can be replaced within the chip: $S \times 2^M$
   (However, a maximum number of relief units that can be replaced within the relief unit block is S.)
(5) Total number of relief block units within the chip: $2^M$ In the mean time, in recent years, it has become most popular that the semiconductor memories having a plurality of banks are used in which the banks can be activated simultaneously and each can be read or written.

In order to improve the yield of a product, it is necessary to improve the relief efficiency of the semiconductor memories. The improvement in the relief efficiency of the semiconductor memories can be achieved by increasing the number of redundancy relief units within each bank (each relief block unit).

However, when the number of relief units is increased, the number of fuse sets provided corresponding to these relief units increases. Thus, the area of the redundancy circuit within the chip increases. As a result, there arises a problem that the area efficiency within the chip is lowered and the chip size increases when a semiconductor memory circuit (excluding the redundancy circuit) is disposed. Particularly, when a statistical distribution of defective memory cells within the chip is a deviation to one bank (relief unit), an attempt to increase the relief efficiency requires a provision of a very large number of relief units and fuse sets within one bank. This leads to an extreme reduction in the area efficiency and an extreme increase in the chip size.

The number of relief units and the number of fuse sets are proportional to the number of banks (relief block units) within the chip. Accordingly, when the number of banks within the chip is increased while maintaining sufficient relief efficiency, it is necessary to increase the number of relief units as well as the number of fuse sets. This leads to a further aggravation in the area efficiency and a further increase in the chip size.

Further, when the number of fuses (fuse sets) becomes larger, this has the following risk. That is, after the semiconductor memory has been tested, there occurs a failure in the accurate disconnection of fuses at the time of disconnecting the fuses by laser in an attempt to register fail addresses for specifying relief units including defective memory cells. This makes it impossible to replace the defective cells with the redundancy circuit. In this case, it is not possible expect any improvement in product yield.

BRIEF SUMMARY OF THE INVENTION

With a view to eliminating the above-described drawbacks, it is an object of the present invention to provide a semiconductor memory having a novel redundancy circuit capable of obtaining high relief efficiency by using a fail address memory (for example, a fuse set) with small memory capacity.

According to one aspect of the present invention, there is provided a semiconductor memory including a normal decoder, a fixed spare decoder for relieving the normal decoder, a fixed memory disposed in association with the fixed spare decoder, a mapping spare decoder for relieving the normal decoder, and a mapping memory disposed independent of the mapping spare decoder, and for being recorded with mapping data. The normal decoder is replaced with the fixed spare decoder when a fail address for specifying the normal decoder is registered in the fixed memory. The normal decoder is replaced with the mapping spare decoder when the fail address is registered in the mapping memory and also when the mapping data specifies the mapping spare decoder.

Further, according to another aspect of the invention, there is provided a semiconductor memory including a plurality of banks, and a mapping memory disposed at the outside of the plurality of banks, with no association with a mapping spare decoder, and for being registered with mapping data. Each bank has a normal decoder, a fixed spare decoder for relieving the normal decoder, a fixed memory disposed in association with the fixed spare decoder, and a mapping spare decoder for relieving the normal decoder. The mapping data has a function of associating the mapping memory with the mapping spare decoder within one of the plurality of banks. Further, when a fail address for selecting the normal decoder within one of the plurality of banks is registered in the mapping memory, the normal decoder is replaced with the mapping spare decoder within one of the banks associated with the mapping memory.

Further, according to still another aspect of the invention, there is provided a semiconductor memory including a plurality of banks, and at least one mapping memory disposed at the outside of the plurality of banks, independent of a mapping spare decoder, and for being registered with mapping data. Each bank has a normal decoder, a fixed spare decoder for relieving the normal decoder, a fixed memory disposed in association with the fixed spare decoder, and at least one mapping spare decoder for relieving the normal decoder. The at least one mapping memory is associated with the at least one mapping spare decoder based on the mapping data registered in the at least one mapping memory. When the number of the plurality of banks is expressed as $2^M$ (M is a natural number), when the number of the at least one mapping spare decoder is expressed as S1 (S1 is a natural number), and also when the number of the at least one mapping memory is expressed as L, the following relationship is satisfied. $1 \geq L \geq 2^M \times S1$.

Further, according to still another aspect of the invention, there is provided a semiconductor memory including a plurality of banks, and a mapping memory disposed at the outside of the plurality of banks, with no association with a mapping spare decoder, and for being registered with mapping data. Each bank has a normal decoder, and a mapping spare decoder for relieving the normal decoder. The mapping data has a function of associating the mapping memory with the mapping spare decoder within one of the plurality of banks. Further, when a fail address for selecting the normal decoder within one of the plurality of banks is registered in the mapping memory, the normal decoder is replaced with the mapping spare decoder within one of the banks associated with the mapping memory.

Further, according to still another aspect of the invention, there is provided a semiconductor memory including a plurality of banks, and at least one mapping memory disposed at the outside of the plurality of banks, with no association with a mapping spare decoder, and for being registered with mapping data. Each bank has a normal decoder, and at least one mapping spare decoder for relieving the normal decoder. The at least one mapping memory is associated with the at least one mapping spare decoder based on the mapping data registered in the at least one mapping memory. When the number of the plurality of banks is expressed as $2^M$ (M is a natural number), when the number of the at least one mapping spare decoder is expressed as S1 (S1 is a natural number), and also when the number of the at least one mapping memory is expressed as L, the following relationship is satisfied. $1 \geq L \geq 2^M \times S1$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a diagram for showing an example of a decoder shown in FIG. 14.

DETAILED DESCRIPTION OF THE INVENTION

A semiconductor memory of the present invention will be explained in detail below with reference to the drawings.

Figure 5:
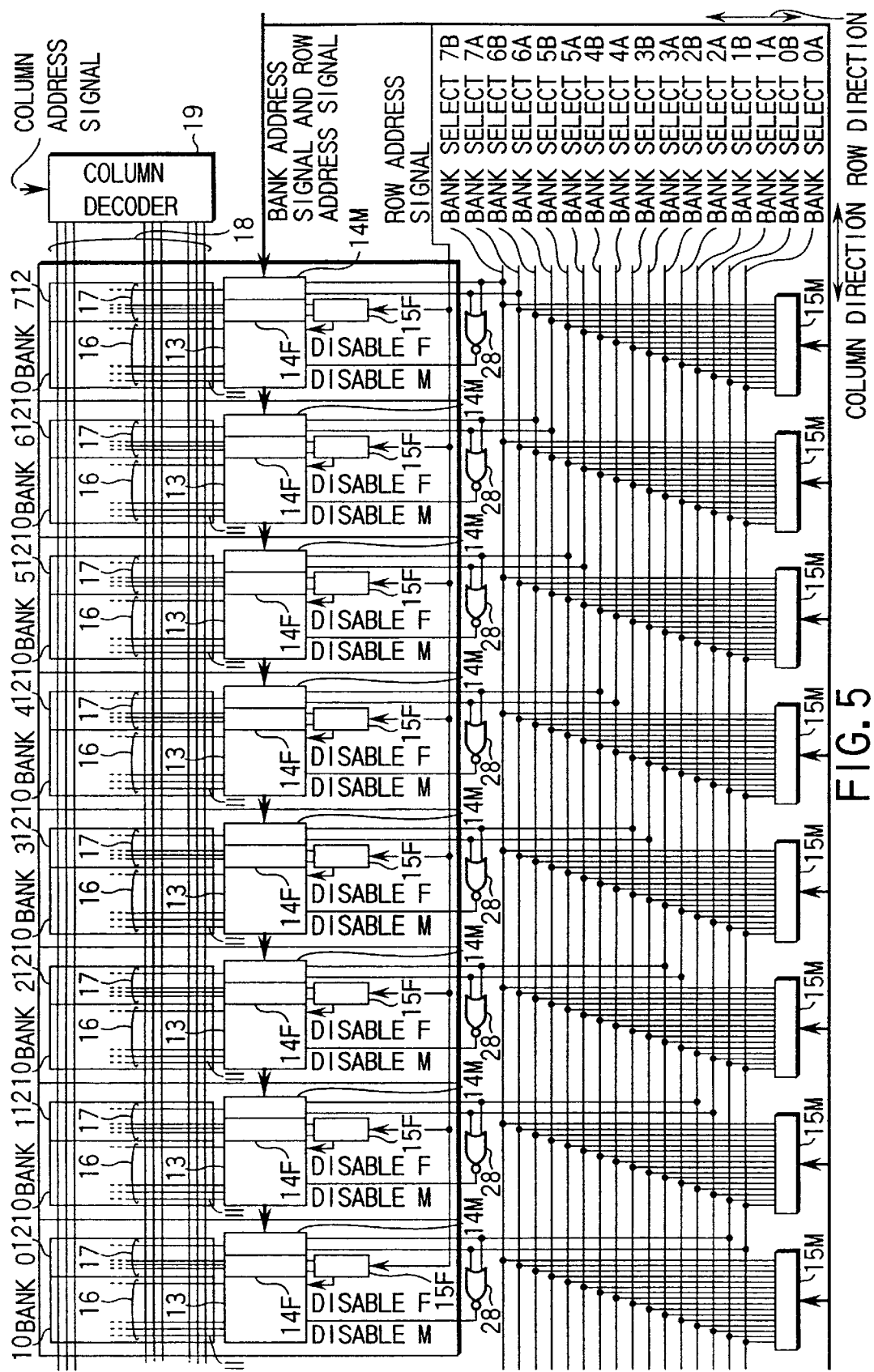
FIG. 5 is a diagram for showing a first example of a semiconductor memory according to the present invention.

FIG. 5 illustrates a main portion of a first example of a semiconductor memory according to the present invention.

In the present example, the semiconductor memory has a plurality of banks that can be accessed substantially simultaneously (including some deviation), and one bank forms a relief block unit and one row decoder forms a relief unit.

In the present example, a memory cell array is structured by eight sub-arrays 10. One sub-array 10 is disposed within one bank BANKi (i=0, 1, . . . 7). Accordingly, eight banks BANK0, BANK1, . . . BANK7 are disposed within the semiconductor memory (memory chip). These banks BANK0, BANK1, . . . BANK7 are adjacently disposed, for example, in a column direction.

Although one sub-array 10 is disposed within one bank BANKi (i=0, 1, . . . 7) in the present example, it is also possible to dispose a plurality of sub-arrays within one bank BANKi (i=0, 1, . . . 7).

Each BANKi (i=0, 1, . . . 7) includes a normal cell array 11, a spare cell array 12, a row decoder 13, a fixed spare row decoder 14F, a mapping spare row decoder 14M, and a fixed fuse set 15.

The normal cell array 11 has a memory capacity of 512 kilobits, for example. On the normal cell array 11, there are disposed 512 word lines 16 and 1,024 pairs of bit lines. In the present example, the number of the row decoders 13 is set to 128, and four word lines 16 are connected to one row decoder. The number of word lines connected to one row decoder may be one or more.

The spare cell array 12 has a memory capacity of sixteen kilobits, for example. On the spare memory cell array 12, there are disposed sixteen spare word lines 17 and 1,024 pairs of bit lines. The number of the fixed spare row decoders 14F is set to two. Four spare word lines 17 are connected to one fixed spare row decoder. Further, the number of the mapping spare row decoders 14M is also set to two, and four spare word lines 17 are connected to one mapping spare row decoder.

The number of word lines connected to one spare row decoder (a fixed spare row decoder or a mapping spare row decoder) is set the same as the number of word lines connected to one row decoder.

A column decoder 19 is disposed adjacent to the BANK7 positioned at the last end of the eight banks BANK0, BANK1, . . . BANK7. A column select line CSL 18 is common to the eight banks BANK0, BANK1, . . . BANK7, and is disposed above the eight banks BANK0, BANK1, BANK7. The column select line CSL 18 extends to the BANK0 side from the column decoder 19.

Figure 1:
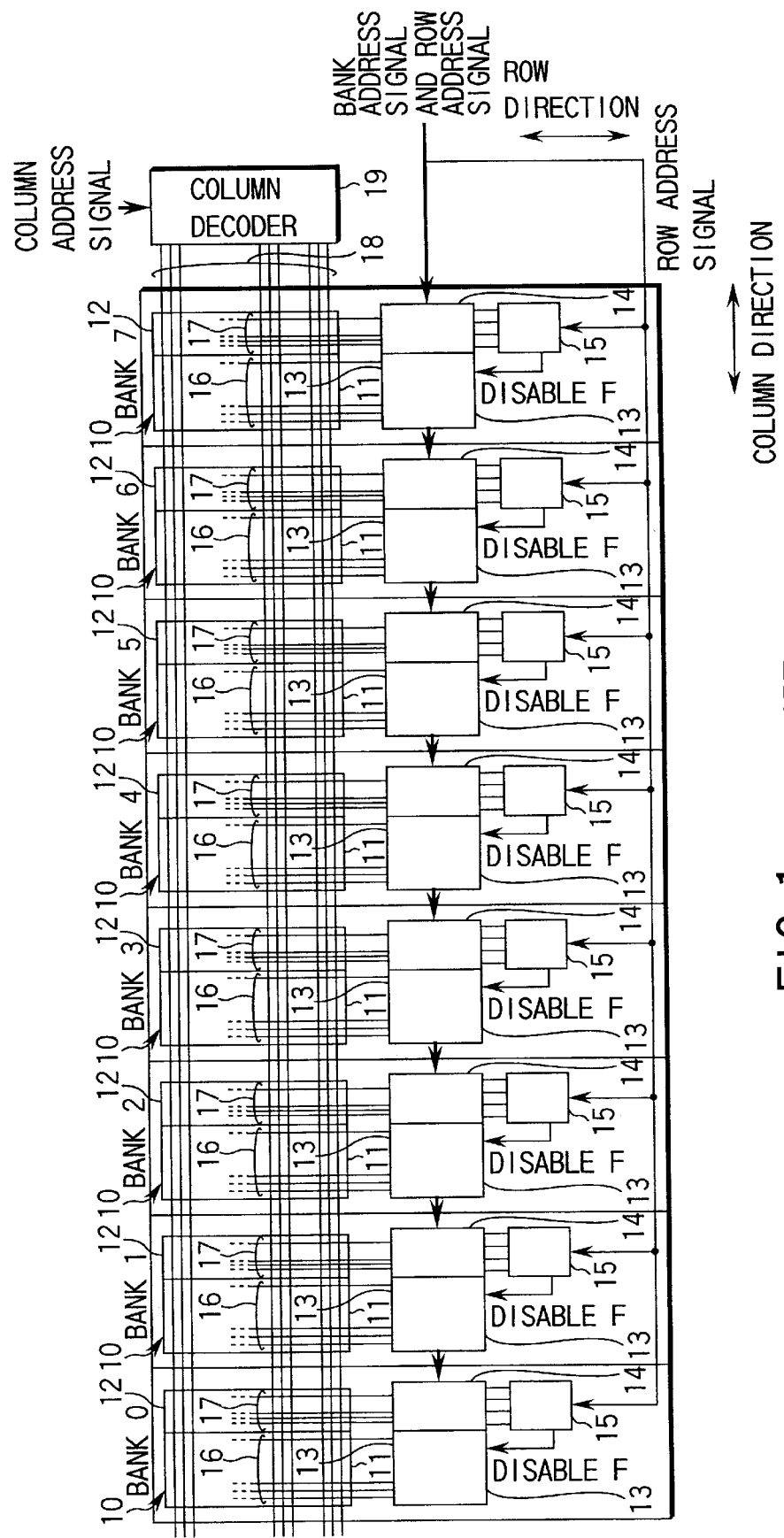
FIG. 1 is a diagram for showing a conventional semiconductor memory.

In the present example, one row decoder (four word lines) is set as a relief unit. For example, in a manner similar to that of the prior-art example shown in FIG. 1, four spare row decoders are disposed within one bank (relief block unit) BANKi (i=0, 1, . . . 7). However, in the present example, two of the four spare row decoders are set as the fixed spare row decoders 14F, and the remaining two spare row decoders are set as the mapping spare row decoders 14M.

The fixed spare row decoders 14F have a function similar to that of the prior-art fixed spare row decoders. In other words, the two fixed spare row decoders 14F within one BANKi (i=0, 1, . . . 7) can be replaced with the two row decoders within this BANKi.

Within each bank BANKi (i=0, 1, . . . 7), two fixed fuse sets 15F are provided corresponding to the two fixed spare row decoders 14F. Each fixed fuse set can store one fail address.

A row address is input to each fixed fuse set. When the row addresses disagree with the fail addresses in all the fixed fuse sets within one bank, the row decoders 13 within this bank become active (DISABLE F="1"), and the spare row decoders 14F become inactive.

Further, when the row address coincides with the fail address in at least one of the fixed fuse sets within one bank, the row decoder 13 within this bank becomes inactive (DISABLE F="0"), and the fixed spare row decoder corresponding to at least one of the fixed fuse sets becomes active.

The mapping spare row decoder 14M has a function different from the function of the conventional fixed spare row decoder. In other words, when there exists a mapping fuse set 15M corresponding to the mapping spare row decoder 14M within one bank, the mapping spare row decoder 14M can be replaced with the row decoder within this bank.

Further, in the case of accessing only one bank instead of simultaneously accessing a plurality of banks, for example, it is also possible to replace a row decoder within one bank with a mapping spare row decoder within a different bank, by the mapping fuse set 15M.

In the present example, two mapping spare row decoders 14M are provided within one bank. Accordingly, sixteen (=2×8 banks) mapping spare row decoders 14M exist in the semiconductor memory (chip memory).

Just like the fixed fuse set is provided corresponding to the fixed spare row decoder, the mapping fuse set 15M is also provided for the mapping spare row decoder 14M.

However, the mapping fuse set 15M is not provided to correspond to the mapping spare row decoder 14M, unlike the fixed fuse set 15F. In other words, the relationship between the mapping fuse set 15M and the mapping spare row decoder 14M is not limited.

Therefore, the mapping fuse set 15M is disposed outside the bank. A maximum number of the mapping fuse sets 15M that can be provided is sixteen, and a minimum number is one. The reason why the maximum number of the mapping fuse sets 15M is sixteen is that the number of the mapping spare row decoders 14M is sixteen.

In the present example, eight mapping fuse sets 15M are provided . However, there is no relationship between the number of eight for the mapping fuse sets 15M and the number of eight for the banks BANK0, BANK1, . . . BANK7.

Corresponding to the sixteen mapping spare row decoders 14M, there are provided sixteen signal lines (buses) BANK SELECT 0A, BANK SELECT 0B, BANK SELECT 1A, BANK SELECT 1B, BANK SELECT 2A, BANK SELECT 2B, BANK SELECT 3A, BANK SELECT 3B, BANK SELECT 4A, BANK SELECT 4B, BANK SELECT 5A, BANK SELECT 5B, BANK SELECT 6A, BANK SELECT 6B, BANK SELECT 7A, and BANK SELECT 7B.

The signal line BANK SELECT 0A, for example, is connected to one of the two mapping spare row decoders 14M within the bank BANK0, and the signal line BANK SELECT 0B is connected to the other of the two mapping spare row decoders 14M within the bank BANK0. As explained above, the signal line BANK SELECT iA (i=0, 1, . . . 7) is connected to one of the two mapping spare row decoders 14M within the bank BANKi, and the signal line BANK SELECT iB is connected to the other of the two mapping spare row decoders 14M within the bank BANKi.

From each mapping fuse set 15M, sixteen output lines are led out. These sixteen output lines are connected to the corresponding sixteen signal lines BANK SELECT iA, BANK SELECT iB (i=0, 1, . . . 7). In the present example, one predetermined output line of each mapping fuse set 15M is connected in common to one predetermined signal line, thereby structuring what is called "wired OR logic". In other words, a result of an OR operation of values of eight output lines of the eight mapping fuse sets 15M connected in common becomes a value of one common signal line.

Each mapping fuse set 15M is input with input addresses (a bank address signal and a row address signal). One mapping fuse set having a fail address that coincides with the input address makes one of the sixteen signal lines BANK SELECT iA, BANK SELECT iB (i=0, 1, . . . 7) active ("1"). When one output line becomes "1", one signal line connected to this output line becomes "1", as each signal line BANK SELECT iA, BANK SELECT iB (i=0, 1, . . . 7) structures the "wired OR logic".

Accordingly, the mapping spare row decoder within the bank corresponding to the active signal line, that is, within the bank specified by the input address, is activated. Then, a defective row decoder within this bank is replaced with the mapping spare row decoder within this bank.

In this case, the row decoder within the bank corresponding to the signal line in the active state becomes inactive (DISABLE M="0"). Further, in the banks of the inactive state, that is, in the banks other than the bank that is specified by the input address, the row decoders become active (DISABLE M="11"), and the mapping spare row decoders become inactive.

On the other hand, when there does not exist a mapping fuse set having a fail address that coincides with the input address, the row decoders in all the banks become active (DISABLE M="1"), and the mapping spare row decoders become inactive.

In the present example, as two mapping spare row decoders are disposed within one bank, it is possible to replace maximum two row decoders within this bank with the mapping spare row decoders within this bank. However, the mapping fuse sets are not provided corresponding to the mapping spare row decoders. Accordingly, each mapping fuse set needs to include mapping data to identify the correspondence of this mapping fuse set to a specific one of the mapping spare row decoders in a specific bank.

Figure 6:
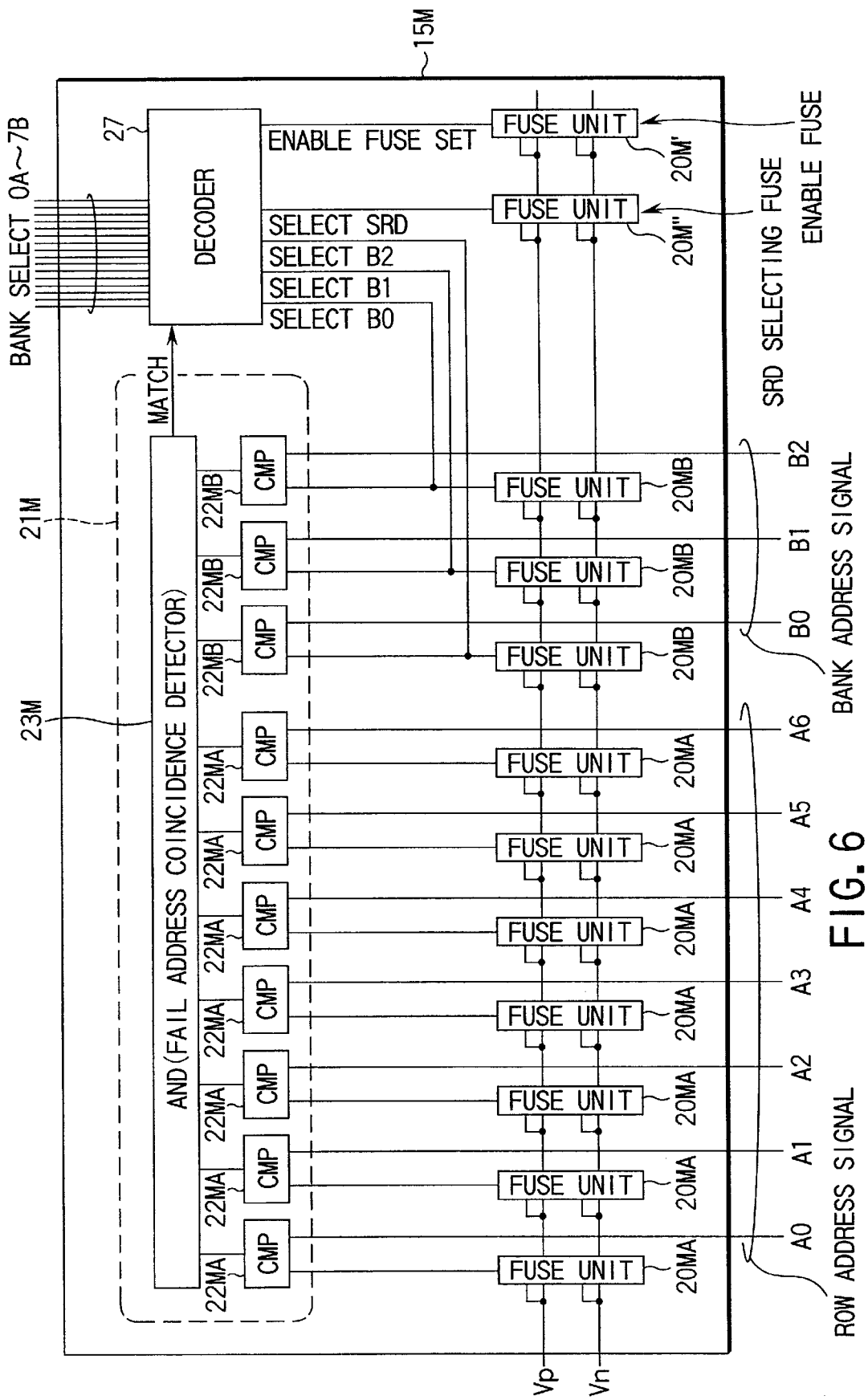
FIG. 6 is a diagram for showing a first example of a mapping fuse set shown in FIG. 5.

FIG. 6 shows a first example of the mapping fuse set shown in FIG. 5.

In the present example, a semiconductor memory is structured by eight banks. In each one bank, there are disposed 128 (=$2^7$) row decoders and two mapping spare row decoders.

When 128 (=$2^7$) row decoders exist in one bank, seven-bit address signals A0, A1, . . . A6 are necessary to specify one of the 128 row decoders. Accordingly, in order to store a fail address, at least seven fuse units (fuse elements) 20MA are necessary.

Further, it is also necessary to provide one fuse unit (fuse element) 20M' as an enable fuse for determining whether the mapping fuse set 15M is to be used or not.

Further, data for making the mapping spare row decoders correspond to the mapping fuse sets, that is, fuse units (fuse elements) 20MB and 20M" for storing the mapping data, are provided by four in total. Of these fuse units, three fuse units 20MB are for making the mapping fuse sets correspond to the banks, and one fuse unit 20M" is for selecting one of the two mapping spare row decoders within the bank.

As explained above, in the present example, twelve (=7+1+4) fuse units (fuse elements) are disposed within one mapping fuse set.

In the present example, it is assumed that a plurality of banks are accessed simultaneously, that is, the eight (=$2^3$) banks are accessed substantially simultaneously. Accordingly, a row decoder is replaced with a mapping spare row decoder within the bank to which the row decoder belongs. Therefore, three fuse units 20MB make the mapping fuse sets correspond to the banks. In other words, the address of a bank to which the row decoder having a defective memory cell is stored in the three fuse units 20MB.

However, in the case of a semiconductor memory in which a plurality of banks are not accessed simultaneously, it is also possible to replace a row decoder within a certain bank with a mapping spare row decoder within other bank. In this case, the number of fuse units for making the mapping fuse sets correspond to the banks becomes six in total. They include, for example, three fuse units for storing the address of a bank to which a row decoder including a defective memory cell belongs, and three fuse units for storing the address of a bank to which a mapping spare row decoder that replaces this row decoder belongs.

Figure 3:
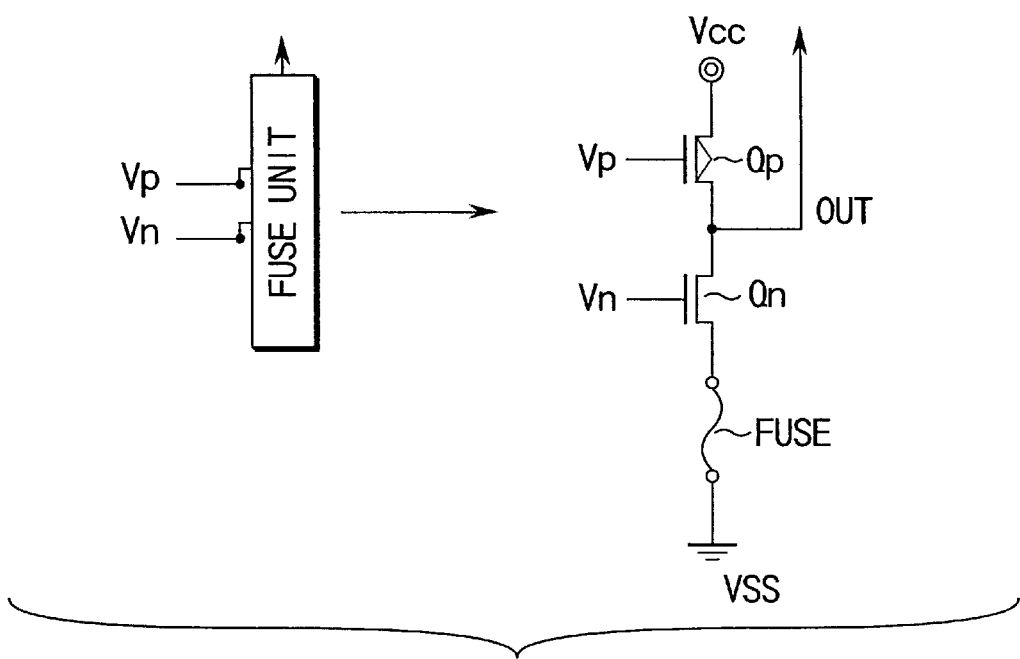
FIG. 3 is a diagram for showing an example of a fuse unit shown in FIG. 2.

One fuse unit is structured by the p-channel MOS transistor Qp, the n-channel MOS transistor Qn, and the fuse element FUSE, that are connected in series between a power source terminal VCC and VSS, as shown in FIG. 3. The output node becomes a connection point between the two MOS transistors Qp and Qn.

Fuse data is read out at first by turning ON the MOS transistor Qp, turning OFF the MOS transistor Qn, then pre-charging the output node to the VCC, and thereafter, by turning OFF the MOS transistor Qp and turning ON the MOS transistor Qn. When the fuse element FUSE is in the disconnected state, the fuse data becomes "1" (maintaining the pre-charge potential VCC). When the fuse element FUSE is not in the disconnected state, the fuse data becomes "0" (VSS).

Output signals of the seven fuse units 20MA for storing a fail address that specifies a row decoder including a defective memory cell are input to comparators 22MA within a fail address coincidence detector 21M. Output signals of the three fuse units 20MB for storing the address (bank address) of a bank to which a row decoder including the defective memory cell belongs, are input to comparators 22MB within the fail address coincidence detector 21M.

The comparators 22MA compare the row address signals A0, A1, ... A6 with the output signals (fail address) of the fuse units 20MA. The comparators 22MB compare band address signals B0, B1, ... B2 with the output signals of the fuse units 20MB.

The comparators 22MA and 22MB are structured by exclusive NOR circuits, for example, respectively. Each exclusive NOR circuit outputs "1" when the signals coincide with each other as a result of the comparison.

Output signals of the comparators 22MA and 22MB are input to an AND circuit (fail address coincidence detector) 23M. Accordingly, when the row addresses A0, A1, ... A6 and the output signals of the fuse units 20MA coincide with each other, and also when the bank addresses B0, B1 and B2 and the output signals of the fuse units 20MB coincide with each other, an output signal MATCH of the AND circuit (fail address coincidence detector) 23M becomes "1".

An output signal ENABLE FUSE SET of the fuse unit 20M' is set to "1" when the mapping fuse set 15M including the fuse unit 20M' is used, and this output signal is set to "0" when the mapping fuse set 15M including the fuse unit 20M' is not used.

An output signal of the fuse unit 20M" is set to "1" when one of the two mapping spare row decoders within the bank is used, and this output signal is set to "0" when the other mapping spare row decoder is used.

A decoder 27 sets one of the sixteen output lines BANK SELECT iA, BANK SELECT iB (i=0, 1, ... 7) to an active state ("1"), based on the output signal MATCH of the AND circuit 23M, output signals SELECT B0, SELECT B1 and SELECT B2 of the fuse units 20MB, an output signal ENABLE FUSE SET of the fuse unit 20M', and an output signal SELECT SRD of the fuse unit 20M".

The signal MATCH is a signal for showing an existence of a row decoder having a defect. When there is a row decoder having a defect, this signal MATCH becomes in an active state ("1"). When the signal MATCH and the signal ENABLE FUSE SET are both active ("1"), the corresponding one of the sixteen output lines BANK SELECT iA and BANK SELECT IB (i=0, 1 ... 7) can become active (the decoder 27 is activated).

Which one of the sixteen output lines BANK SELECT iA and BANK SELECT IB (i=0, 1 ... 7) is to be set to the active state is determined by the signals SELECT B0, SELECT B1, SELECT B2 and SELECT SRD. One of the sixteen output lines BANK SELECT iA and BANK SELECT IB (i=0, 1 ... 7). can be selected by the four-bit signals SELECT B0, SELECT B1, SELECT B2 and SELECT SRD.

Then, as shown in FIG. 5, one mapping spare row decoder corresponding to the one output line in the active state ("1") is activated. In the bank having this mapping spare row decoder, DISABLE M becomes "0" by the NOR circuit 28, so that the row decoder is activated.

As all the remaining 15 output lines are in the inactive state ("0"), the mapping spare row decoders corresponding to these output lines are deactivated. In the banks where both of the two mapping spare row decoders are in the inactive state, DISABLE M becomes "1" by the NOR circuit 28, so that the row decoders are activated.

Figure 7:
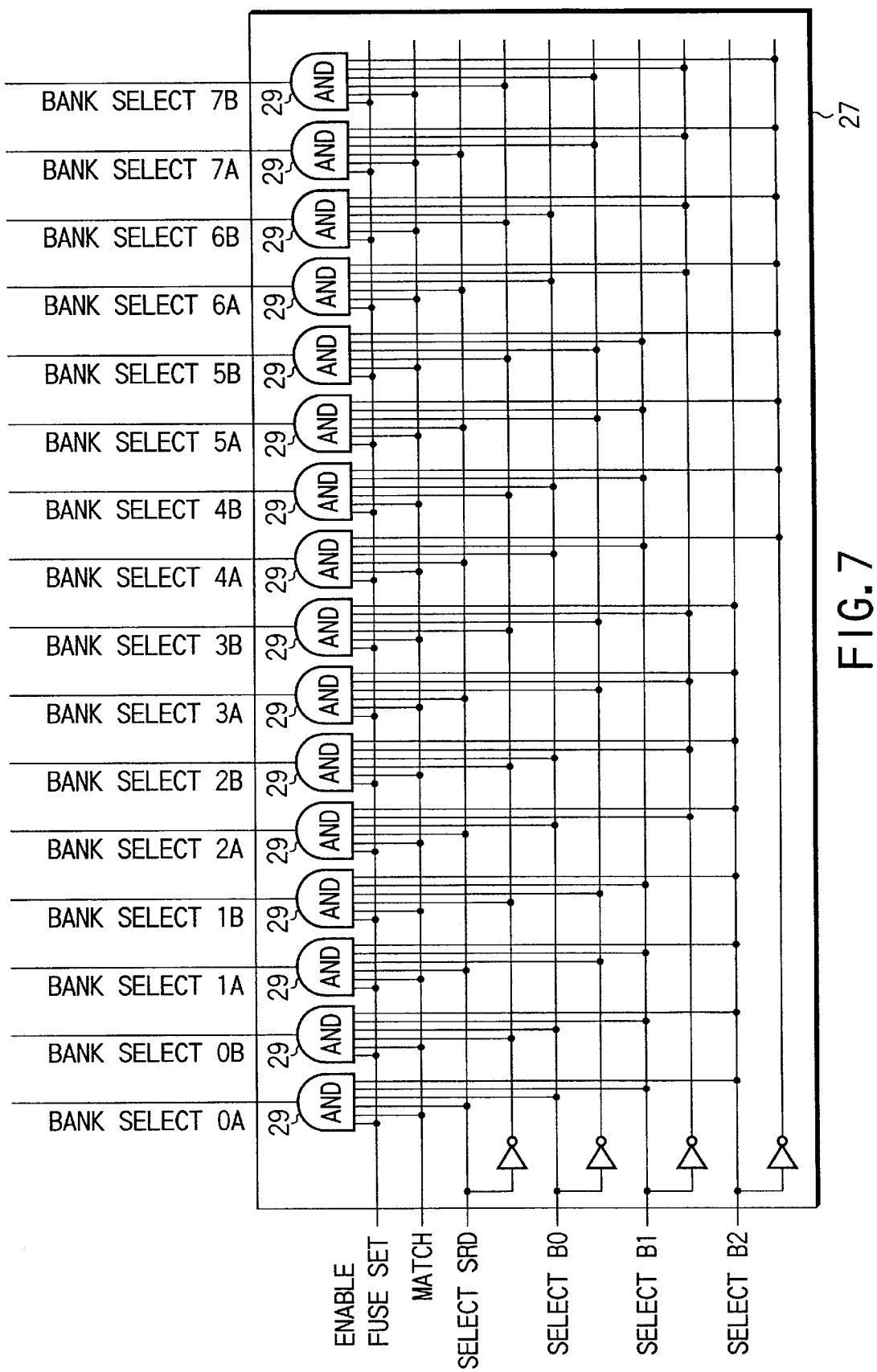
FIG. 7 is a diagram for showing an example of a decoder shown in FIG. 6.

FIG. 7 shows an example of a decoder within the mapping fuse set shown in FIG. 6.

The decoder in the present example is structured by sixteen AND circuits 29. Each AND circuit 29 is input with one of the sixteen combinations of the four-bit signals SELECT B0, SELECT B1, SELECT B2 and SELECT SRD. Further, each AND circuit 29 is also input with the signal MATCH and the signal ENABLE FUSE SET.

The sixteen AND circuits 29 are connected to the sixteen signal lines BANK SELECT iA and BANK SELECT IB (i=0, 1 ... 7). As two mapping spare row decoders are disposed within one bank, two AND circuits and two signal lines are provided corresponding to each bank.

In the present example, the bank address of the bank 0 is expressed as "111", the bank address of the bank 1 is expressed as "110", the bank address of the bank 2 is expressed as "101", the bank address of the bank 3 is expressed as "100", the bank address of the bank 4 is expressed as "011", the bank address of the bank 5 is expressed as "010", the bank address of the bank 6 is expressed as "001", and the bank address of the bank 7 is expressed as "000", When a row decoder including a defective memory cell exists within the bank 0, for example, "1" is stored in the fuse set (enable fuse) 20M' within the mapping fuse set shown in FIG. 6, and the row address of the row decoder is stored in the fuse set 20MA. Further, the bank address "111" of the bank 0 is stored in the fuse set 20MB, and "1" or "0" is stored in the fuse set 20M".

In this case, the signal MATCH becomes "1" when there have been input the bank address signals B0, B1 and B2 and the row address signals A0, A1, ... A6 for specifying a row decoder including a defective memory cell within the bank 0. In this case, the signals SELECT B0, SELECT B1 and SELECT B2 become "111". Accordingly, when the signal SELECT SRD is "1", the BANK SELECT 0A corresponding to one of the two mapping spare row decoders of the bank 0 becomes "1". Further, when the signal SELECT SRD is "0", the BANK SELECT 0B corresponding to the other of the two mapping spare row decoders of the bank 0 becomes "1".

Figure 8:
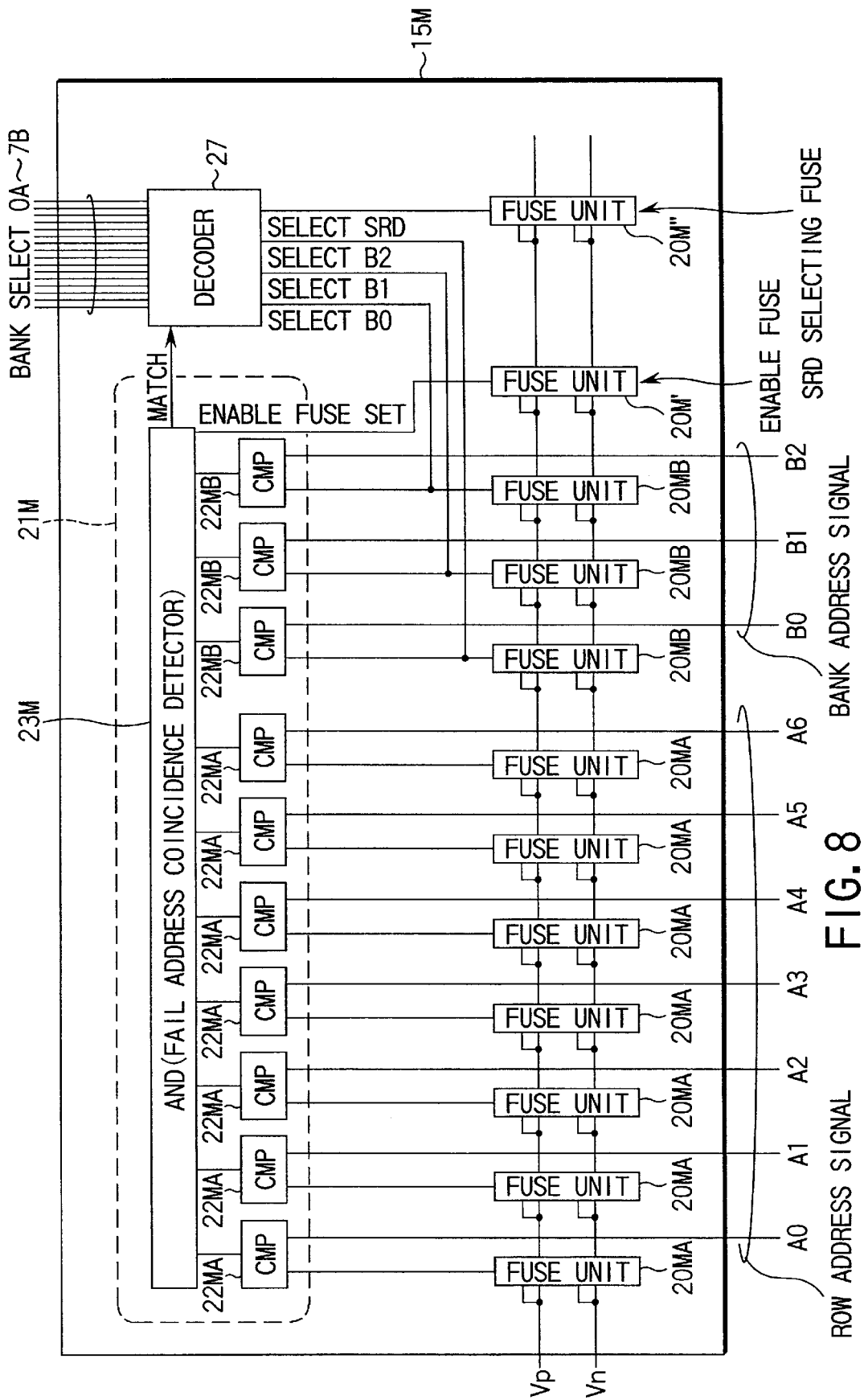
FIG. 8 is a diagram for showing a second example of the mapping fuse set shown in FIG. 2.

FIG. 8 shows a second example of the mapping fuse set shown in FIG. 5.

The mapping fuse set of the present example is characterized in that, as compared with the first example shown in FIG. 6, the output signal ENABLE FUSE SET of the fuse unit (enable fuse) 20M' is not input to the decoder 27 but is input to the AND circuit (fail address coincidence detector) 23M.

In other words, when the signal ENABLE FUSE SET is "1", the AND circuit 23M is activated. In this case, when the address signals (a bank address signal and a row address signal) coincide with the output signals of the fuse units 20MA and 20MB, the signal MATCH becomes "1".

A detailed structure will be explained below.

In the present example, a semiconductor memory is structured by eight banks. In each one bank, there are disposed 128 ($=2^7$) row decoders and two mapping spare row decoders.

When 128 ($=2^7$) row decoders exist in one bank, seven-bit address signals A0, A1, . . . A6 are necessary to specify one of the 128 row decoders. Accordingly, in order to store a fail address, at least seven fuse units (fuse elements) 20MA are necessary.

Further, it is also necessary to provide one fuse unit (fuse element) 20M' as an enable fuse for determining whether the mapping fuse set 15M is to be used or not.

Further, data for making the mapping spare row decoders correspond to the mapping fuse sets, that is, fuse units (fuse elements) 20MB and 20M" for storing the mapping data, are provided by four in total. Of these fuse units, three fuse units 20MB are for making the mapping fuse sets correspond to the banks, and one fuse unit 20M" is for selecting one of the two mapping spare row decoders within the bank.

Output signals of the seven fuse units 20MA for storing a fail address that specifies a row decoder including a defective memory cell are input to comparators 22MA within a fail address coincidence detector 21M. Output signals of the three fuse units 20MB for storing the address (bank address) of a bank to which a row decoder including the defective memory cell belongs, are input to comparators 22MB within the fail address coincidence detector 21M.

The comparators 22MA compare the row address signals A0, A1, . . . A6 with the output signals (fail address) of the fuse units 20MA. The comparators 22MB compare band address signals B0, B1, . . . B2 with the output signals of the fuse units 20MB.

The comparators 22MA and 22MB are structured by exclusive NOR circuits, for example, respectively. Each exclusive NOR circuit outputs "1" when the signals coincide with each other as a result of the comparison.

Output signals of the comparators 22MA and 22MB and an output signal ENABLE FUSE SET of the fuse unit (enable fuse) 20M' are input to an AND circuit (fail address coincidence detector) 23M respectively. The AND circuit 23M is activated when the signal ENABLE FUSE SET is "1". In this case, the output signal MATCH becomes "1" when the row addresses A0, A1, . . . A6 and the output signals of the fuse units 20MA coincide with each other, and also when the bank addresses B0, B1 and B2 and the output signals of the fuse units 20MB coincide with each other.

An output signal ENABLE FUSE SET of the fuse unit 20M' is set to "1" when the mapping fuse set 15M including the fuse unit 20M' is used, and this output signal is set to "0" when the mapping fuse set 15M including the fuse unit 20M' is not used.

The output signal ENABLE FUSE SET of the fuse unit 20M" is set to "1" when the mapping fuse set 15M including the fuse unit 20M' is used, and this output signal is set to "0" when the mapping fuse set 15M is not used.

An output signal of the fuse unit 20M" is set to "1" when one of the two mapping spare row decoders within the bank is used, and this output signal is set to "0" when the other mapping spare row decoder is used.

A decoder 27 sets one of the sixteen output lines BANK SELECT iA, BANK SELECT IB (i=0, 1 . . . 7) to an active state ("1"), based on the output signal MATCH of the AND circuit 23M, output signals SELECT B0, SELECT B1 and SELECT B2 of the fuse units 20MB, and an output signal SELECT SRD of the fuse unit 20M".

The signal MATCH is a signal for showing an existence of a row decoder having a defect. When there is a row decoder having a defect, this signal MATCH becomes in an active state ("1"). When the signal MATCH is active ("1"), the corresponding one of the sixteen output lines BANK SELECT iA and BANK SELECT IB (i=0, 1 . . . 7) can become active (the decoder 27 is activated).

Which one of the sixteen output lines BANK SELECT iA and BANK SELECT IB (i=0, 1 . . . 7) is to be set to the active state is determined by the signals SELECT B0, SELECT B1, SELECT B2 and SELECT SRD. In other words, one of the sixteen output lines BANK SELECT iA and BANK SELECT IB (i=0, 1 . . . 7) is selected by the four-bit signals SELECT B0, SELECT B1, SELECT B2 and SELECT SRD.

Figure 9:
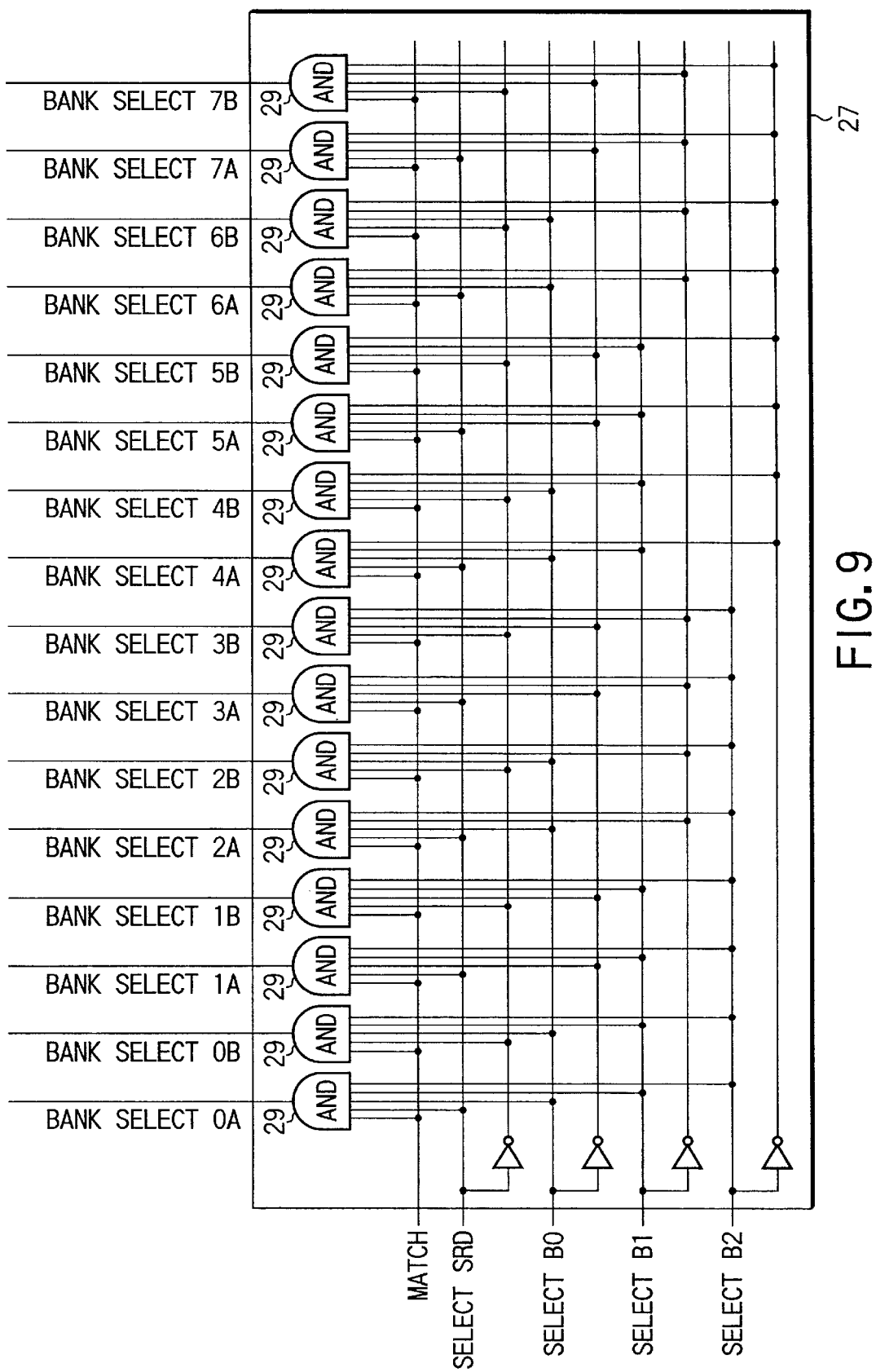
FIG. 9 is a diagram for showing an example of a decoder shown in FIG. 8.

FIG. 9 shows an example of a decoder within the mapping fuse set shown in FIG. 8.

The present example is characterized in that, as compared with the example shown in FIG. 7, the signal ENABLE FUSE SET is not input to the decoder 27. This is because the signal ENABLE FUSE SET is input to the AND circuit 23M shown in FIG. 8, and the signal MATCH includes the data of the signal ENABLE FUSE SET.

According to the decoder of the present example, each of the sixteen AND circuits 29 is input with one of sixteen combinations of the four-bit signals SELECT B0, SELECT B1, SELECT B2, and SELECT SRD, and the signal MATCH.

The sixteen AND circuits 29 are connected to the sixteen signal lines BANK SELECT iA and BANK SELECT IB (i=0, 1 . . . 7). As two mapping spare row decoders are disposed within one bank, two AND circuits and two signal lines are provided corresponding to each bank.

When a row decoder including a defective memory cell exists within the bank 0, for example, "1" is stored in the fuse set (enable fuse) 20M' within the mapping fuse set shown in FIG. 8, and the row address of the row decoder is stored in the fuse set 20MA. Further, the bank address "111" of the bank 0 is stored in the fuse set 20MB, and "1" or "0" is stored in the fuse set 20M".

In this case, the signal MATCH becomes "1" when there have been input the bank address signals B0, B1 and B2 and the row address signals A0, A1, . . . A6 for specifying a row decoder including a defective memory cell within the bank 0. In this case, the signals SELECT B0, SELECT B1 and SELECT B2 become "111". Accordingly, when the signal SELECT SRD is "1", the BANK SELECT 0A corresponding to one of the two mapping spare row decoders of the bank 0 becomes "1". Further, when the signal SELECT SRD is "0", the BANK SELECT 0B corresponding to the other of the two mapping spare row decoders of the bank 0 becomes "1".

Figure 10:
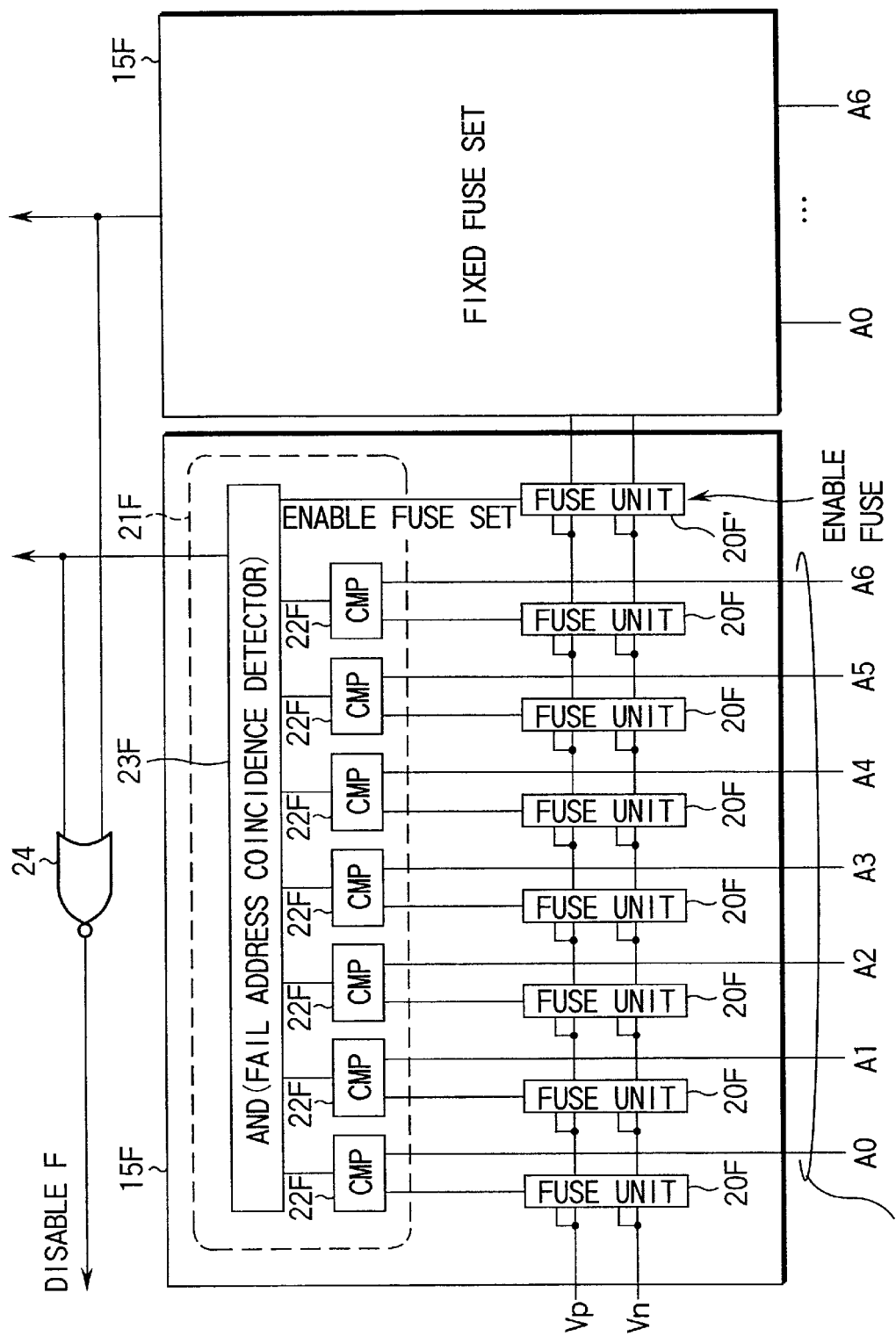
FIG. 10 is a diagram for showing an example of a fixed fuse set shown in FIG. 5.

FIG. 10 shows an example of a fixed fuse set within a bank.

Figure 2:
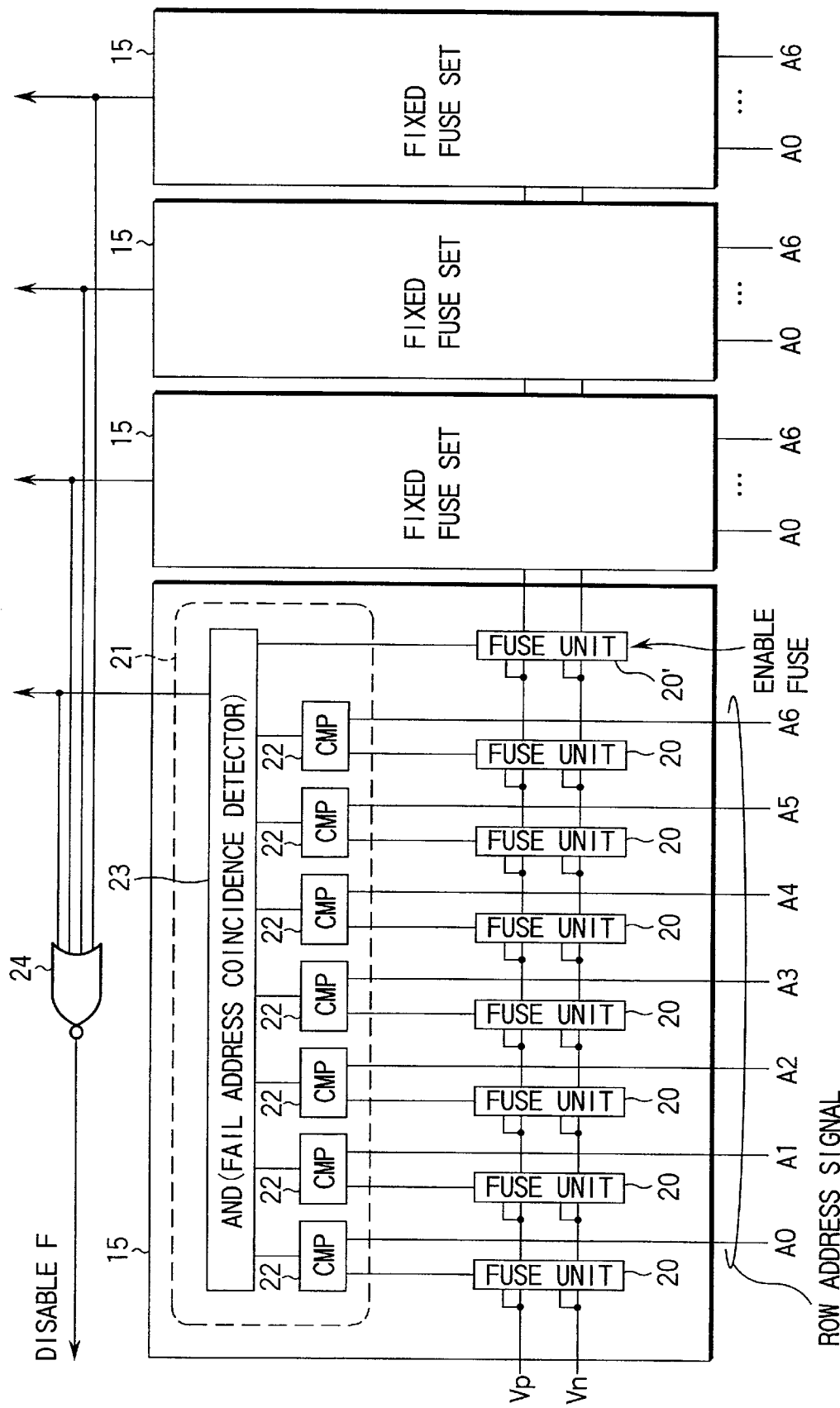
FIG. 2 is a diagram for showing an example of a fixed fuse set shown in FIG. 1.

In the present example, two fixed fuse sets 15F are disposed corresponding to the two fixed spare row decoders 14 shown in FIG. 2. Accordingly, when the semiconductor memory is structured by eight banks as shown in the example of FIG. 5, the fixed spare row decoders and the fixed fuse sets exist by sixteen (=2×8) respectively within the semiconductor memory (memory chip).

Conventionally, only thirty-two fixed spare row decoders and fixed fuse sets in total have been provided within the semiconductor memory, for example. On the other hand, according to the present invention, in addition to the sixteen fixed spare row decoders and sixteen fixed fuse sets, there are provided further sixteen mapping spare row decoders in the semiconductor memory, as described above. Further, the number of the mapping fuse set is set to at least one and not more than sixteen. The effects of this structure will be explained in detail later.

When there exist 128 (=$2^7$) row decoders within one bank as shown in the example of FIG. 5, seven-bit address signals A0, A1, . . . A6 are necessary in order to specify one of the 128 row decoders. Therefore, in order to store a fail address, at least seven fuse units (fuse elements) 20F are necessary.

In the present example, one fuse unit (fuse element) 20F' is provided as an enable fuse unit for determining whether the fixed fuse set 15 is to be used or not. Accordingly, within one fixed fuse set 15, the fuse units 20F and 20F' are provided by eight in total. For the fuse unit, it is possible to use a structure as shown in FIG. 3, for example.

Output signals of the seven fuse units 20 for storing a fail address are input to comparators 22 within a fail address coincidence detector 21. The comparators 22 compare the input addresses A0, A1, . . . A6 with the output signals (fail addresses) of the fuse units 20F. The comparators 22F are structured by exclusive NOR circuits, for example, and they output "1" when the input addresses coincide with the fail addresses.

Output signals of the comparators 22F and an output signal of the fuse unit 20F' are input to an AND circuit (a fail address coincidence detector) 23F. The output signal of the fuse unit (enable fuse) 20F' is set to "1" when the fixed fuse set 15F including this fuse unit 20F' is used. The output signal of the fuse unit (enable fuse) 20F' is being set to "0" when the fixed fuse set 15F including this fuse unit 20F' is not used.

Accordingly, when the fixed fuse set 15F is used and also when the row addresses A0, A1, . . . A6 coincide with the fail address, the output signal of the AND circuit 23F becomes "1", so that the fixed spare row decoder is activated. In this case, an output DISABLE F of an NOR circuit 24 becomes "0", and the row decoder is deactivated. When the output signals of the two fixed fuse sets 15F are "0", the output signal DISABLE F of the NOR circuit 24 becomes "1", so that the row decoder is activated.

Figure 4:
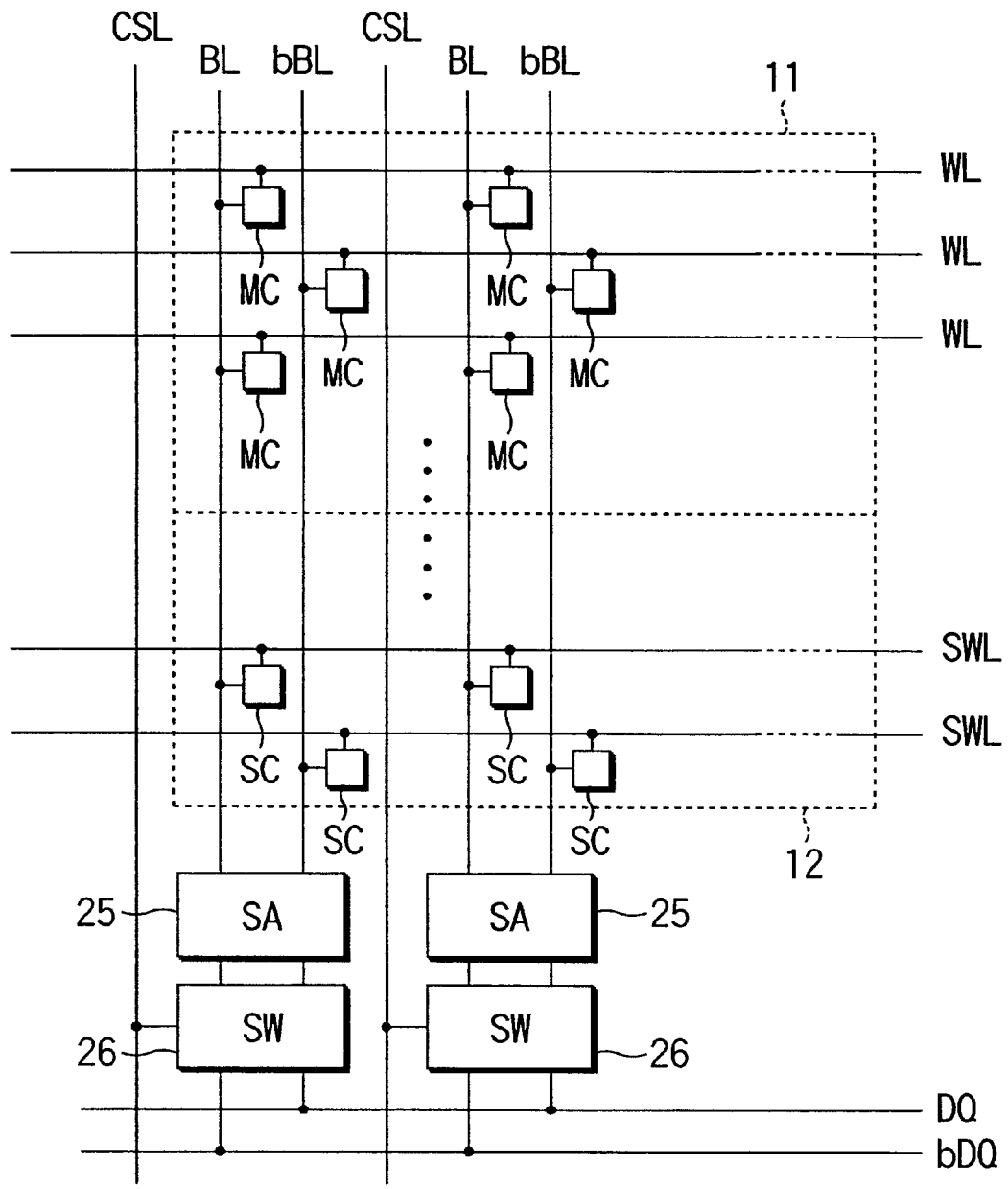
FIG. 4 is a diagram for showing a sub-array and its surroundings shown in FIG. 1.

In the example of FIG. 5, the sub-arrays within the bank and their surroundings become similar to those of the prior-art example as shown in FIG. 4.

A sense amplifier 25 and a column select switch 26 are disposed within each bank to make it possible to carry out a simultaneous accessing of a plurality of banks. A pair of bit lines BL and bBL are connected to the sense amplifier 25. In the present example, the pair of bit lines BL and bBL are connected to only one side of the sense amplifier 25. However, the pair of bit lines BL and bBL can also be connected to both sides of the sense amplifier 25.

Memory cells MC are connected to each word line WL, and spare cells (redundancy memory cells) SC are connected to each spare word line SWL. The pair of bit lines BL and bBL are connected to a pair of data lines (a pair of DQ lines) DQ and bDQ through the sense amplifier 25 and the column select switch 26.

The column select lines CSL are connected to the column select switches 26, and the column select lines CSL are provided in common to the plurality of banks as shown in FIG. 5. Column address signals are decoded by column decoders, and decoded results are transmitted to the column select switches 26 through the column select lines CSL.

Figure 11:
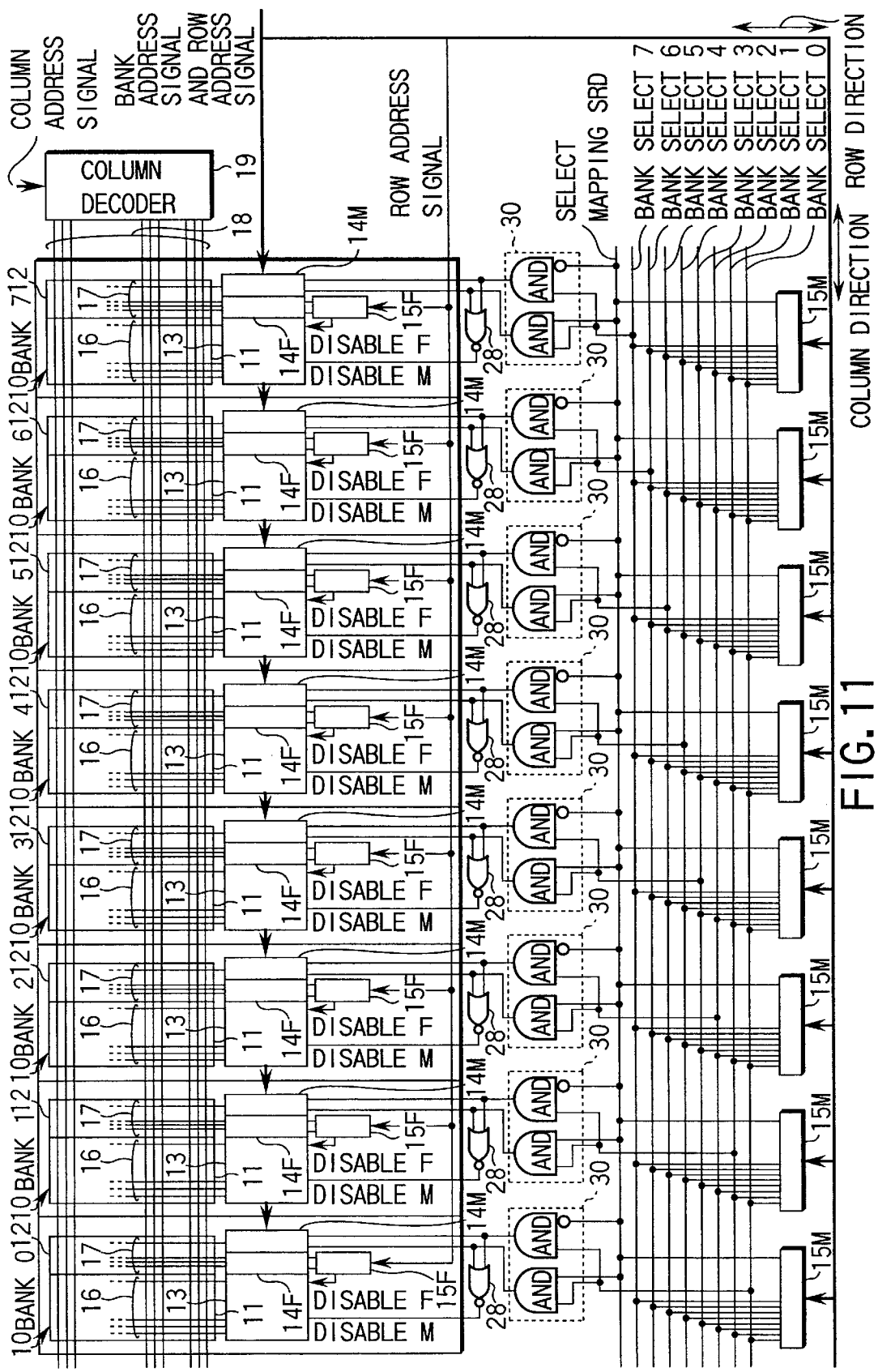
FIG. 11 is a diagram for showing a second example of the semiconductor memory according to the present invention.

FIG. 11 shows a main portion of a second example of the semiconductor memory according to the present invention.

The semiconductor memory of the present example is characterized in that, as compared with the above-described semiconductor memory of the first example, the number of signal lines (buses) having a function of the "wired OR logic" for connecting the mapping spare row decoders 14M with the mapping fuse sets 15M is smaller.

In other words, according to the above-described first example of the semiconductor memory, as the signal lines (buses) are provided corresponding to the mapping spare row decoders, the number of the signal lines is equal to the number of the mapping spare row decoders (sixteen in the first example). On the other hand, according to the present example, a plurality (for example, two) of mapping spare row decoders within a bank are selected not within the mapping fuse set, but at the outside of the mapping fuse set based on a predetermined logic. Thus, it is possible to decrease the number of signal lines from that of the first example.

A detailed structure of the present example will be explained below.

In the present example, similar to the first example, the semiconductor memory has a plurality of banks that can be accessed substantially simultaneously (including some deviation), and one bank forms a relief block unit and one row decoder forms a relief unit.

A memory cell array is structured by eight sub-arrays 10, and one sub-array 10 is disposed within one bank BANKi (i=0, 1, . . . 7). Accordingly, eight banks BANK0, BANK1, . . . BANK7 are disposed within the semiconductor memory (memory chip). These banks BANK0, BANK1, . . . BANK7 are adjacently disposed in a column direction, for example.

Each BANKi (i=0, 1, . . . 7) includes a normal cell array 11, a spare cell array 12, a row decoder 13, a fixed spare row decoder 14F, a mapping spare row decoder 14M, and a fixed fuse set 15F.

The normal cell array 11 has a memory capacity of 512 kilobits, for example. On the normal cell array 11, there are disposed 512 word lines 16 and 1,024 pairs of bit lines. In the present example, the number of the row decoders 13 is set to 128, and four word lines 16 are connected to one row decoder. The number of word lines connected to one row decoder may be one or more.

The spare cell array 12 has a memory capacity of sixteen kilobits, for example. On the spare memory cell array 12, there are disposed sixteen spare word lines 17 and 1,024 pairs of bit lines. The number of the fixed spare row decoders 14F is set to two, and four spare word lines 17 are connected to one fixed spare row decoder. Further, the number of the mapping spare row decoders 14M is also set to two, and four spare word lines 17 are connected to one mapping spare row decoder.

The number of word lines connected to one spare row decoder (a fixed spare row decoder or a mapping spare row decoder) is set the same as the number of word lines connected to one row decoder.

A column decoder 19 is disposed adjacent to the BANK7 positioned at the last end of the eight banks BANK0, BANK1, . . . BANK7. A column select line CSL 18 is common to the eight banks BANK0, BANK1, . . . BANK7, and is disposed above the eight banks BANK0, BANK1, . . . BANK7. The column select line CSL 18 extends to the BANK0 side from the column decoder 19.

In the present example, one row decoder (four word lines) is set as a relief unit. For example, four spare row decoders are disposed within one bank (relief block unit) BANKi (i=0, 1, . . . 7). Further, two of the four spare row decoders are set as the fixed spare row decoders 14F, and the remaining two spare row decoders are set as the mapping spare row decoders 14M.

The fixed spare row decoders 14F have a function similar to that of the prior-art fixed spare row decoders. In other words, the two fixed spare row decoders 14F within one BANKi (i=0, 1, . . . 7) can be replaced with the two row decoders within this BANKi.

Within each bank BANKi (i=0, 1, . . . 7), two fixed fuse sets 15F are provided corresponding to the two fixed spare row decoders 14F. Each fixed fuse set can store one fail address.

A row address is input to each fixed fuse set. When the row addresses disagree with the fail addresses in all the fixed fuse sets within a certain bank, the row decoders 13 within this bank become active (DISABLE F="1"), and the spare row decoders 14F become inactive.

Further, when the row address coincides with the fail address in at least one of the fixed fuse sets within a certain bank, the row decoder 13 within this bank becomes inactive (DISABLE F="0"), and the fixed spare row decoder corresponding to at least one of the fixed fuse sets becomes active.

The mapping spare row decoder 14M has a function different from the function of the prior-art fixed spare row decoder. In other words, when there exists a mapping fuse set corresponding to a mapping spare row decoder within a certain bank, the mapping spare row decoder can be replaced with the row decoder within this bank.

Further, in the case of accessing only one bank instead of simultaneously accessing a plurality of banks, for example, it is also possible to replace the row decoder within a certain bank with a mapping spare row decoder within a different bank, by the mapping fuse set.

In the present example, two mapping spare row decoders 14M are provided within one bank. Accordingly, sixteen (=2×8 banks) mapping spare row decoders 14M exist in the semiconductor memory (chip memory).

Just like a fixed fuse set is provided corresponding to a fixed spare row decoder, the mapping fuse set 15M is also provided for the mapping spare row decoder 14M.

However, the mapping fuse set 15M is not provided to correspond to the mapping spare row decoder 14M, unlike the fixed fuse set 15F. In other words, the relationship between the mapping fuse set 15M and the mapping spare row decoder 14M is not limited.

Accordingly, the mapping fuse set 15M is disposed outside the bank. A maximum number of the mapping fuse sets 15M that can be provided is sixteen, and a minimum number is one. The reason why the maximum number of the mapping fuse sets 15M is sixteen is that the number of the mapping spare row decoders 14M is sixteen.

In the present example, the mapping fuse sets 15M are provided by eight. However, there is no relationship between the number of eights for the mapping fuse sets 15M and the number of eight for the banks BANK0, BANK1, . . . BANK7.

Corresponding to the eight banks BANK0, BANK1, . . . BANK7, there are provided eight signal lines (buses) BANK SELECT 0, BANK SELECT 1, BANK SELECT 2, BANK SELECT 3, BANK SELECT 4, BANK SELECT 5, BANK SELECT 6, and BANK SELECT 7.

For example, the signal line BANK SELECT 0 corresponds to the two mapping spare row decoders 14M within the bank BANK0, and the signal line BANK SELECT 1 corresponds to the two mapping spare row decoders 14M within the bank BANK0. As explained above, the signal line BANK SELECT i (i=0, 1 . . . 7) corresponds to the two mapping spare row decoders 14M within the bank BANKi.

Further, there is provided one signal line SELECT MAPPING SRD for selecting one of the two mapping spare row decoders within each bank BANKi (i=0, 1, . . . 7).

In other words, according to the present example, the total number of signal lines (buses) for connecting between the mapping spare row decoders 14M and the mapping fuse sets 15M is nine, which includes eight signal lines (buses) BANK SELECTi and one signal line SELECT MAPPING SRD.

From each mapping fuse set 15M, nine output lines are led out. These nine output lines are connected to the corresponding nine signal lines BANK SELECT i (i=0, 1, . . . 7) and SELECT MAPPING SRD.

In the present example, one predetermined output line of each mapping fuse set 15M is connected in common to one predetermined signal line, thereby structuring what is called "wired OR logic". In other words, a result of an OR operation of values of eight output lines of the eight mapping fuse sets 15M connected in common becomes a value of one common signal line.

Each mapping fuse set 15M is input with input addresses (a bank address signal and a row address signal). One mapping fuse set having a fail address that coincides with the input address makes one of the eight signal lines BANK SELECT i (i=0, 1, . . . 7) active ("1"). When one output line becomes "1", one signal line connected to this output line becomes "1", as each signal line BANK SELECT i (i=0, 1, . . . 7) structures the "wired OR logic".

Further, one mapping fuse set having a fail address that coincides with the input address makes one signal line SELECT MAPPING SRD active ("1") or inactive ("0"). In other words, the output of a mapping fuse set having a fail address that does not coincide with the input address or an unused mapping fuse set, is fixed to an inactive state ("0"). Therefore, the value of a signal line SELECT MAPPING SRD that structures the "wired OR logic" is determined by an output value of the one mapping fuse set having the fail set that coincides with the input address.

Accordingly, the bank corresponding to the active signal line, that is, the bank specified by the input address, is activated. Then, a mapping spare row decoder corresponding to the value of the signal line SELECT MAPPNG SRD is activated within this selected bank.

In this case, the row decoder within the selected bank becomes inactive (DISABLE M="0"). Further, in the banks corresponding to the signal line in the inactive state, that is, in the non-selected banks, the row decoders become active (DISABLE M="1"), and the mapping spare row decoders become inactive.

On the other hand, when there does not exist a mapping fuse set having a fail address that coincides with the input address, the row decoders in all the banks become active (DISABLE M="1"), and the mapping spare row decoders become inactive.

In the present example, as two mapping spare row decoders are disposed within one bank, it is possible to replace maximum two row decoders within this bank with the mapping spare row decoders within this bank. However, the mapping fuse sets are not provided corresponding to the mapping spare row decoders.

Accordingly, each mapping fuse set needs to include mapping data to identify the correspondence of this mapping fuse set to a specific one of the mapping spare row decoders in a specific bank.

Figure 12:
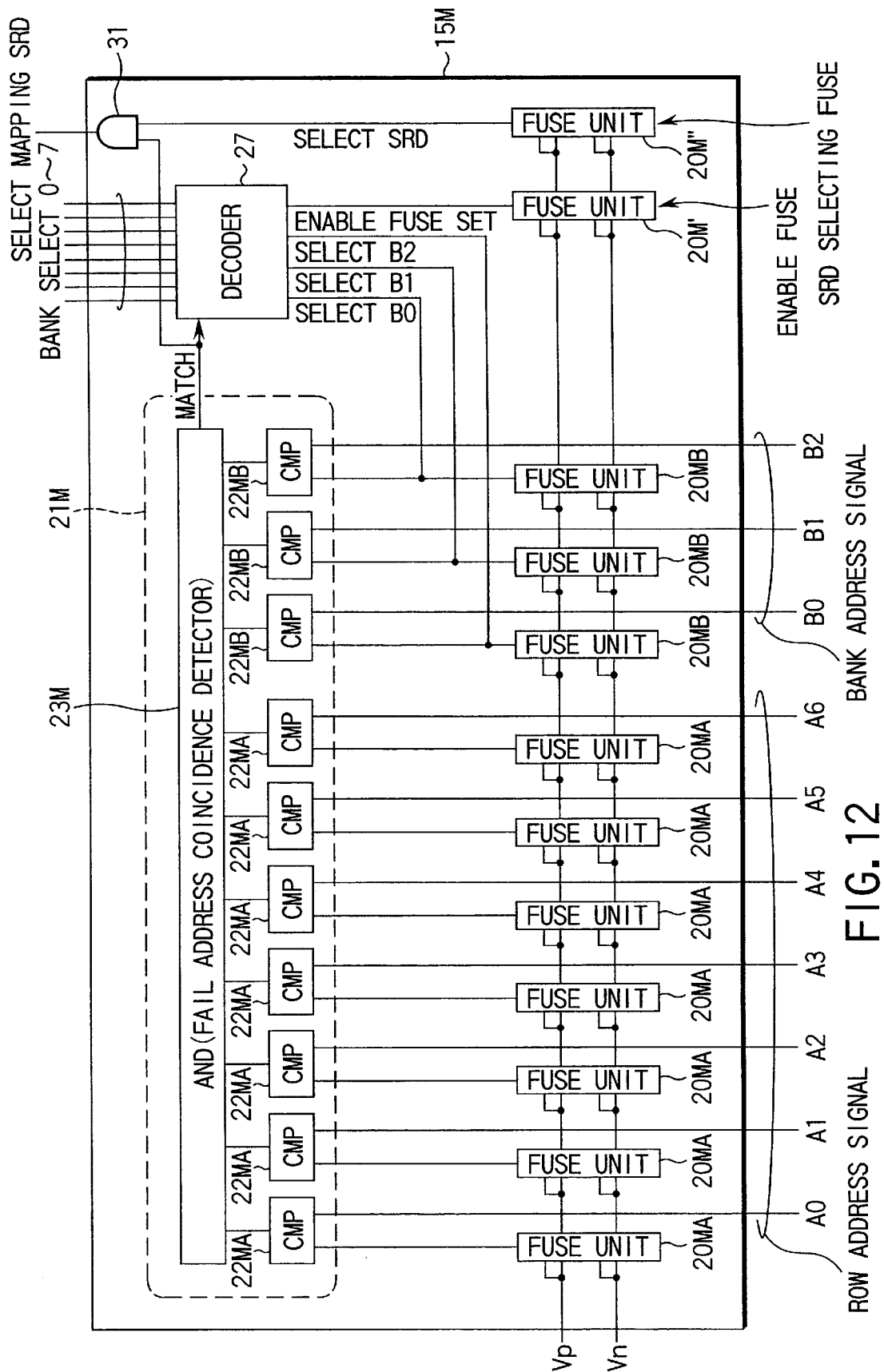
FIG. 12 is a diagram for showing a first example of a mapping fuse set shown in FIG. 11.

FIG. 12 shows a first example of the mapping fuse set shown in FIG. 11.

In the present example, a semiconductor memory is structured by eight banks. In each one bank, there are disposed 128 (=$2^7$) row decoders and two mapping spare row decoders.

When 128 (=$2^7$) row decoders exist in one bank, seven-bit address signals A0, A1, ... A6 are necessary to specify one of the 128 row decoders. Accordingly, in order to store a fail address, at least seven fuse units (fuse elements) 20MA are necessary.

Further, it is also necessary to provide one fuse unit (fuse element) 20M' as an enable fuse for determining whether the mapping fuse set 15M is to be used or not.

Further, data for making the mapping spare row decoders correspond to the mapping fuse sets, that is, fuse units (fuse elements) 20MB and 20M" for storing the mapping data, are provided by four in total. Of these fuse units, three fuse units 20MB are for making the mapping fuse sets correspond to the banks, and one fuse unit 20M" is for selecting one of the two mapping spare row decoders within the bank.

As explained above, in the present example, twelve (=7+1+4) fuse units (fuse elements) are disposed within one mapping fuse set.

In the present example, it is assumed that a plurality of banks are accessed simultaneously, that is, the eight (=$2^3$) banks are accessed substantially simultaneously. Accordingly, a row decoder is replaced with a mapping spare row decoder within the bank to which the row decoder belongs. Therefore, three fuse units 20MB make the mapping fuse sets correspond to the banks. In other words, the address of a bank to which the row decoder having a defective memory cell is stored in the three fuse units 20MB.

However, in the case of a semiconductor memory in which a plurality of banks are not accessed simultaneously, it is also possible to replace a row decoder within a certain bank with a mapping spare row decoder within other bank. In this case, the number of fuse units for making the mapping fuse sets correspond to the banks becomes six in total. They include, for example, three fuse units for storing the address of a bank to which a row decoder including a defective memory cell belongs, and three fuse units for storing the address of a bank to which a mapping spare row decoder that replaces this row decoder belongs.

For the fuse unit, it is possible to use a structure as shown in FIG. 3, for example.

Output signals of the seven fuse units 20MA for storing a fail address that specifies a row decoder including a defective memory cell are input to comparators 22MA within a fail address coincidence detector 21M. Output signals of the three fuse units 20MB for storing the address (bank address) of a bank to which a row decoder including the defective memory cell belongs, are input to comparators 22MB within the fail address coincidence detector 21M.

The comparators 22MA compare the row address signals A0, A1, ... A6 with the output signals (fail address) of the fuse units 20MA. The comparators 22MB compare band address signals B0, B1, ... B2 with the output signals of the fuse units 20MB.

The comparators 22MA and 22MB are structured by exclusive NOR circuits, for example, respectively. Each exclusive NOR circuit outputs "1" when the signals coincide with each other as a result of the comparison.

Output signals of the comparators 22MA and 22MB are input to an AND circuit (fail address coincidence detector) 23M. Accordingly, when the row addresses A0, A1, ... A6 and the output signals of the fuse units 20MA coincide with each other, and also when the bank addresses B0, B1 and B2 and the output signals of the fuse units 20MB coincide with each other, an output signal MATCH of the AND circuit (fail address coincidence detector) 23M becomes "1".

An output signal ENABLE FUSE SET of the fuse unit 20M' is set to "1" when the mapping fuse set 15M including the fuse unit 20M' is used, and this output signal is set to "0" when the mapping fuse set 15M including the fuse unit 20M' is not used.

An output signal of the fuse unit 20M" is set to "1" when one of the two mapping spare row decoders within the bank is used, and this output signal is set to "0" when the other mapping spare row decoder is used.

A decoder 27 sets one of the eight output lines BANK SELECT i (i=0, 1, ... 7) to an active state ("1"), based on the output signal MATCH of the AND circuit 23M, output signals SELECT B0, SELECT B1 and SELECT B2 of the fuse units 20MB, and an output signal ENABLE FUSE SET of the fuse unit 20M'.

The signal MATCH is a signal for showing an existence of a row decoder having a defect. When there is a row decoder having a defect, this signal MATCH becomes in an active state ("1"). When the signal MATCH and the signal ENABLE FUSE SET are both active ("1"), the corresponding one of the eight output lines BANK SELECT i (i=0, 1 ... 7) can become active (the decoder 27 is activated).

Which one of the eight output lines BANK SELECT i (i=0, 1 ... 7) is to be set to the active state is determined by the signals SELECT B0, SELECT B1 and SELECT B2. One of the eight output lines BANK SELECT i (i=0, 1 ... 7) can be selected by the three-bit signals SELECT B0, SELECT B1 and SELECT B2.

Then, as shown in FIG. 11, two AND circuits 30 corresponding to the one output line in the active state ("1") are activated. These two AND circuits exists by eight sets, and they correspond to the eight banks BANK0, BANK1, ... BANK7. Further, when the output signal SELECT SRD of the fuse unit 20M" has entered the AND circuit 31, the output signal SELECT MAPPING SRD is output from the AND circuit 31. The signal MATCH is also input to the AND circuit 31. Accordingly, only the bank in which the signal MATCH is "1", that is, the bank having a fail address that coincides with the input address, can output mapping data (an output signal SELECT MAPPING SRD ("1"or "0") based on the value of the fuse unit 20M").

This output signal SELECT MAPPING SRD is input to the two AND circuits 30 provided corresponding to each bank shown in FIG. 11. Accordingly, one of the two mapping spare row decoders within the bank corresponding to the active AND circuit 30 is selected and activated.

Output signals SELECT MAPPING SRD in the remaining banks in which the signal MATCH is "0" are all fixed to "0".

As explained above, one of the two mapping spare row decoders within the bank to which a row decoder having a defective memory cell belongs, is activated. In this case, in this bank, DISABLE M becomes "0" by the NOR circuit 28, so that the row decoder is deactivated.

As all the remaining seven output lines are in the inactive state ("0"), the output signals of the two AND circuits 30 corresponding to these output lines are set to "0". Accordingly, within the seven banks corresponding to the output lines of the remaining seven output lines, the mapping spare row decoders are deactivated, and DISABLE M is set to "1" by the NOR circuit 28. As a result, their row decoders are activated.

Figure 13:
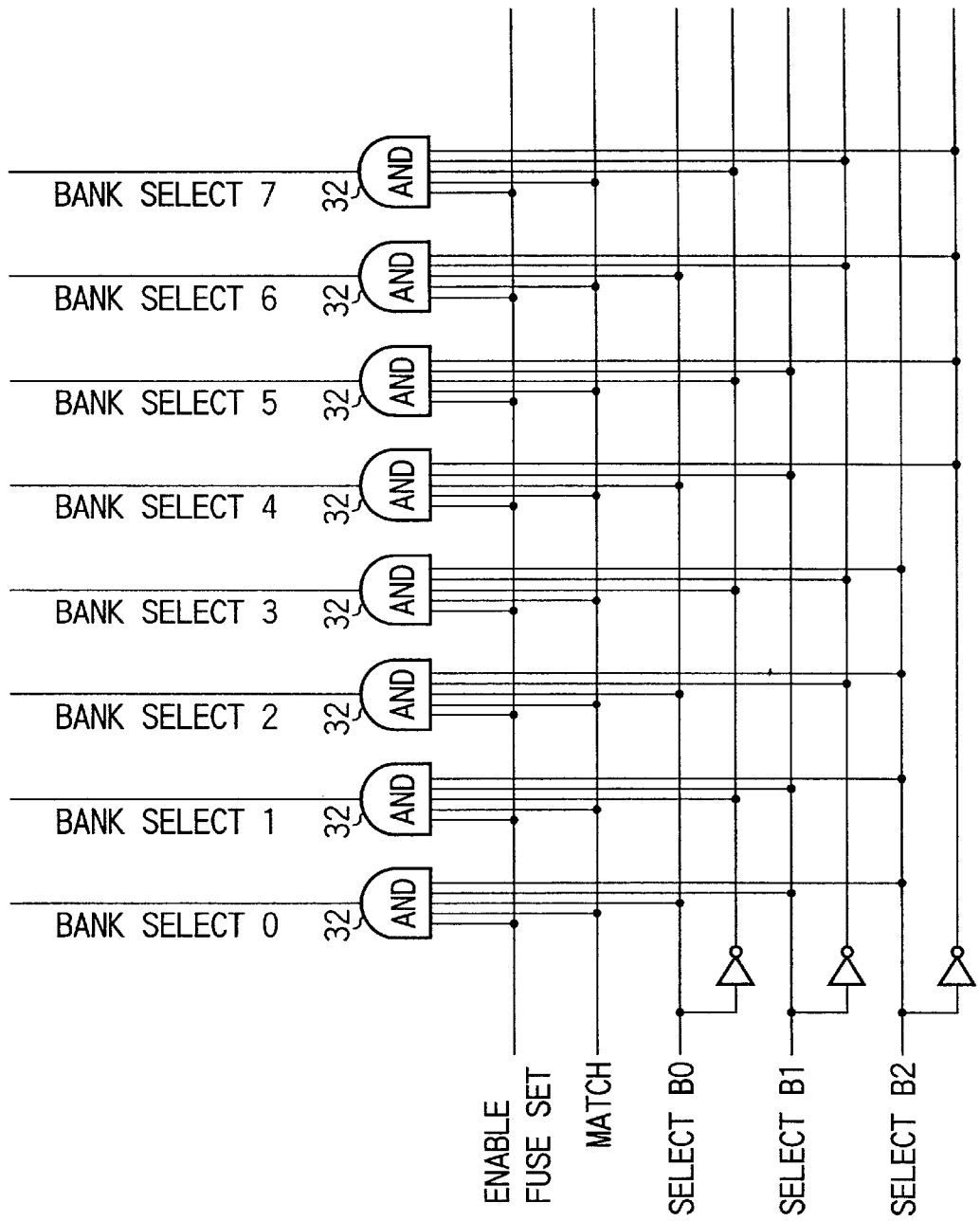
FIG. 13 is a diagram for showing an example of a decoder shown in FIG. 12.

FIG. 13 shows an example of a decoder within the mapping fuse set shown in FIG. 12.

The decoder in the present example is structured by eight AND circuits 32. Each AND circuit 32 is input with one of the eight combinations of the three-bit signals SELECT B0, SELECT B1 and SELECT B2. Further, each AND circuit 32 is also input with the signal MATCH and the signal ENABLE FUSE SET.

The eight AND circuits 32 are connected to the eight signal lines BANK SELECT i (i=0, 1 ... 7). Each signal line BANK SELECT i (i=0, 1 ... 7) is for activating the two AND circuits 30 (shown in FIG. 11) provided corresponding to each bank, as described above.

In the present example, the bank address of the bank 0 is expressed as "111", the bank address of the bank 1 is expressed as "110", the bank address of the bank 2 is expressed as "101", the bank address of the bank 3 is expressed as "100", the bank address of the bank 4 is expressed as "011", the bank address of the bank 5 is expressed as "010", the bank address of the bank 6 is expressed as "001", and the bank address of the bank 7 is expressed as "000", When a row decoder including a defective memory cell exists within the bank 0, for example, "1" is stored in the fuse set (enable fuse) 20M' within the mapping fuse set shown in FIG. 12, and the row address of the row decoder is stored in the fuse set 20MA. Further, the bank address "111" of the bank 0 is stored in the fuse set 20MB, and "1" or "0" is stored in the fuse set 20M".

In this case, the signal MATCH becomes "1" when there have been input the bank address signals B0, B1 and B2 and the row address signals A0, A1, ... A6 for specifying a row decoder including a defective memory cell within the bank 0. In this case, the signals SELECT B0, SELECT B1 and SELECT B2 become "111". Accordingly, the signal line BANK SELECT 0 becomes "1", and the two AND circuits 30 (FIG. 11) corresponding to the bank 0 is activated.

As a result, when the signal line SELECT MAPPING SRD is "1", one of the two mapping spare row decoders within the bank 0 is activated. Further, when the signal line SELECT MAPPING SRD is "0", the other of the two mapping spare row decoders within the bank 0 is activated.

Figure 14:
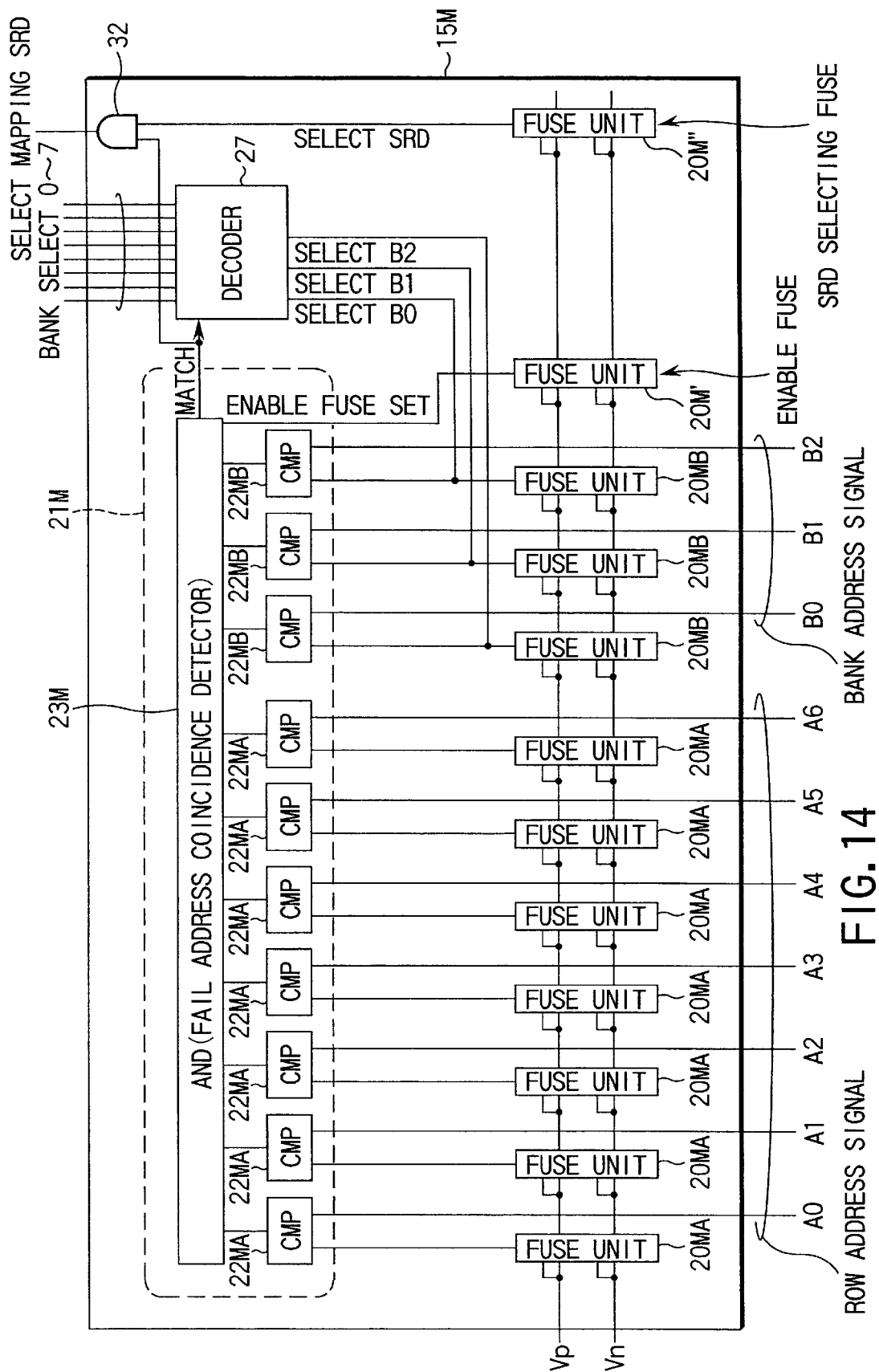
FIG. 14 is a diagram for showing a second example of the mapping fuse set shown in FIG. 11.

FIG. 14 shows a second example of the mapping fuse set shown in FIG. 11.

The mapping fuse set of the present example is characterized in that, as compared with the first example shown in FIG. 12, the output signal ENABLE FUSE SET of the fuse unit (enable fuse) 20M' is not input to the decoder 27 but is input to the AND circuit (fail address coincidence detector) 23M.

In other words, when the signal ENABLE FUSE SET is "1", the AND circuit 23M is activated. In this case, when the address signals (a bank address signal and a row address signal) coincide with the output signals of the fuse units 20MA and 20MB, the signal MATCH becomes "1".

A detailed structure will be explained below.

In the present example, a semiconductor memory is structured by eight banks. In each one bank, there are disposed 128 ($=2^7$) row decoders and two mapping spare row decoders.

When 128 ($=2^7$) row decoders exist in one bank, seven-bit address signals A0, A1, ... A6 are necessary to specify one of the 128 row decoders. Accordingly, in order to store a fail address, at least seven fuse units (fuse elements) 20MA are necessary.

Further, it is also necessary to provide one fuse unit (fuse element) 20M' as an enable fuse for determining whether the mapping fuse set 15M is to be used or not.

Further, data for making the mapping spare row decoders correspond to the mapping fuse sets, that is, fuse units (fuse elements) 20MB and 20M" for storing the mapping data, are provided by four in total. Of these fuse units, three fuse units 20MB are for making the mapping fuse sets correspond to the banks, and one fuse unit 20M" is for selecting one of the two mapping spare row decoders within the bank.

Output signals of the seven fuse units 20MA for storing a fail address that specifies a row decoder including a defective memory cell are input to comparators 22MA within a fail address coincidence detector 21M. Output signals of the three fuse units 20MB for storing the address (bank address) of a bank to which a row decoder including the defective memory cell belongs, are input to comparators 22MB within the fail address coincidence detector 21M.

The comparators 22MA compare the row address signals A0, A1, ... A6 with the output signals (fail address) of the fuse units 20MA. The comparators 22MB compare band address signals B0, B1, ... B2 with the output signals of the fuse units 20MB.

The comparators 22MA and 22MB are structured by exclusive NOR circuits, for example, respectively. Each exclusive NOR circuit outputs "1" when the signals coincide with each other as a result of the comparison.

Output signals of the comparators 22MA and 22MB and an output signal ENABLE FUSE SET of the fuse unit (enable fuse) 20M' are input to an AND circuit (fail address coincidence detector) 23M respectively. The AND circuit 23M is activated when the signal ENABLE FUSE SET is "1". In this case, the output signal MATCH becomes "1" when the row addresses A0, A1, ... A6 and the output signals of the fuse units 20MA coincide with each other, and also when the bank addresses B0, B1 and B2 and the output signals of the fuse units 20MB coincide with each other.

An output signal ENABLE FUSE SET of the fuse unit 20M' is set to "1"when the mapping fuse set 15M including the fuse unit 20M' is used, and this output signal is set to "0" when the mapping fuse set 15M including the fuse unit 20M' is not used.

An output signal SELECT SRD of the fuse unit 20M" is set to "1" when one of the two mapping spare row decoders within the bank is used, and this output signal is set to "0" when the other mapping spare row decoder is used.

A decoder 27 sets one of the eight output lines BANK SELECT i (i=0, 1, ... 7) to an active state ("1"), based on the output signal MATCH of the AND circuit 23M and output signals SELECT B0, SELECT B1 and SELECT B2.

The signal MATCH is a signal for showing an existence of a row decoder having a defect. When there is a row decoder having a defect, this signal MATCH becomes in an active state ("1"). When the signal MATCH is active ("1"), the corresponding one of the eight output lines BANK SELECT i (i=0, 1 ... 7) can become active (the decoder 27 is activated).

Which one of the eight output lines BANK SELECT i (i=0, 1 ... 7) is to be set to the active state is determined by the signals SELECT B0, SELECT B1 and SELECT B2. In other words, one of the eight output lines BANK SELECT i (i=0, 1 ... 7) is selected by the three-bit signals SELECT B0, SELECT B1 and SELECT B2.

Then, as shown in FIG. 11, two AND circuits 30 corresponding to the one output line in the active state ("1") are activated. These two AND circuits exists by eight sets, and they correspond to the eight banks BANK0, BANK1, ... BANK7.

Further, when the output signal SELECT SRD of the fuse unit 20M" has entered the AND circuit 32, the output signal SELECT MAPPING SRD is output from the AND circuit 32. The signal MATCH is also input to the AND circuit 32. Accordingly, only the bank in which the signal MATCH is "1", that is, the bank having a fail address that coincides with the input address, can output mapping data (an output signal SELECT MAPPING SRD ("1"or "0") based on the value of the fuse unit 20M").

This output signal SELECT MAPPING SRD is input to the two AND circuits 30 provided corresponding to each bank shown in FIG. 11. Accordingly, one of the two mapping spare row decoders within the bank corresponding to the active AND circuit 30 is selected and activated.

Output signals SELECT MAPPING SRD in the remaining banks in which the signal MATCH is "0"are all fixed to "0".

As explained above, one of the two mapping spare row decoders within the bank to which a row decoder having a defective memory cell belongs, is activated. In this case, in this bank, DISABLE M becomes "0" by the NOR circuit 28, so that the row decoder is deactivated.

As all the remaining seven output lines are in the inactive state ("0"), the output signals of the two AND circuits 30 corresponding to these output lines are set to "0". Accordingly, within the seven banks corresponding to the output lines of the remaining seven output lines, the mapping spare row decoders are deactivated, and DISABLE M is set to "1" by the NOR circuit 28. As a result, their row decoders are activated.

FIG 15 shows an example of a decoder within the mapping fuse set shown in FIG. 14.

The present example is characterized in that, as compared with the example shown in FIG. 13, the signal ENABLE FUSE SET is not input to the decoder 27. This is because the signal ENABLE FUSE SET is input to the AND circuit 23M shown in FIG. 14, and the signal MATCH includes the data of ENABLE FUSE SET.

According to the decoder of the present example, each of the eight AND circuits 33 is input with one of eight combinations of the three-bit signals SELECT B0, SELECT B1 and SELECT B2, and the signal MATCH.

The eight AND circuits 33 are connected to the eight signal lines BANK SELECT i (i=0, 1 ... 7). Each signal line BANK SELECT i (i=0, 1 ... 7) is for activating the two AND circuits 30 (shown in FIG. 11) provided corresponding to each bank, as described above.

When a row decoder including a defective memory cell exists within the bank 0, for example, "1" is stored in the fuse set (enable fuse) 20M' within the mapping fuse set shown in FIG. 14, and the row address of the row decoder is stored in the fuse set 20MA. Further, the bank address "111" of the bank 0 is stored in the fuse set 20MB, and "1" or "0" is stored in the fuse set 20M".

In this case, the signal MATCH becomes "1" when there have been input the bank address signals B0, B1 and B2 and the row address signals A0, A1, ... A6 for specifying a row decoder including a defective memory cell within the bank 0. In this case, the signals SELECT B0, SELECT B1 and SELECT B2 become "111". Accordingly, the signal line BANK SELECT 0 becomes "1", and the two AND circuits 30 (shown in FIG. 11) corresponding to the bank 0 are activated.

As a result, when the signal line SELECT MAPPING SRD is "1", one of the two mapping spare row decoders within the bank 0 is activated. Further, when the signal line SELECT MAPPING SRD is "0", the other of the two mapping spare row decoders within the bank 0 is activated.

In the second example of the semiconductor memory according to the present invention, the fixed fuse set becomes as shown in FIG. 10, for example, and the structure of the sub-arrays within each bank and their surroundings becomes as shown in FIG. 4, for example.

The examples of the structures of the semiconductor memory according to the present invention have been explained above. Next, the effects of employing these structures will be examined. In other words, a relationship between the number of fuse sets (fuse elements) within the semiconductor memory (memory chip) and the number of relief units that can be relieved by the fuse sets will be examined.

It is assumed that one bank forms a relief block unit and that $2^M$ (M is a natural number) relief block units are disposed within one semiconductor memory. Further, it is also assumed that, within one relief block unit, there exist $2^N$ relief units (row decoders) assigned by N-bit addresses (N is a natural number), SO (SO is a natural number) fixed redundancy relief units (fixed spare row decoder), and S1 (S1 is a natural number) mapping redundancy relief units (mapping spare row decoders).

Further, it is also assumed that mapping fail address memories (mapping fuse sets) exist by L (L is a natural number) within the semiconductor memory (chip memory).

The total number of redundancy fuses within the semiconductor memory will be examined.

At first, the fixed fuse sets will be considered.

The total number of fuses within one fixed fuse set is as follows.

(1) An enable fuse for determining the use or non-use of a fixed fuse set One
(2) A fuse for storing one of $2^N$ row decoders, that is, a fuse for storing N-bit address (fail address): N (=log $[2^N]$/log $[2]$)

In other words, (N+1) fuses are disposed within one fixed fuse set.

Further, the fixed fuse sets are provided corresponding to the fixed spare row decoders. In other words, the number of the fixed fuse sets within the semiconductor is equal to the number of the fixed spare row decoders. As the number of the fixed spare row decoders is S0 and the number of the banks (relief block unit) is $2^M$, the fixed fuse sets are provided by $S0 \times 2^M$ within the semiconductor memory (chip).

Accordingly, the total number of the fuses to be used for the fixed fuse sets within the semiconductor memory becomes as follows.

$$(N+1) \times S0 \times 2^M \quad (1)$$

Next, the mapping fuse sets will be considered.

The total number of fuses within one mapping fuse set is as follows.

(1) An enable fuse for determining the use or non-use of a mapping fuse set: One
(2) A fuse for storing one of $2^N$ row decoders, that is, a fuse for storing N-bit address (fail address): N ($=\log [2^N]/\log [2]$)
(3) A fuse for mapping (corresponding) the mapping fuse set to one of the 2M banks: M($=\log [2^M]/\log [2]$)
(4) A fuse for selecting one of the S1 mapping spare row decoders within one bank: long [S1]/log [2]

In other words, $(1+N+M+\log [S1]/\log [2])$ fuses are set within one mapping fuse set.

Further, the mapping fuse sets are provided by L within the semiconductor memory, where L is 1 or above and is not larger than $S1 \times 2^M$.

Accordingly, the total number of the fuses to be used for the mapping fuse sets within the semiconductor memory becomes as follows.

$$(1+N+M+\log [S1]/\log [2]) \times L \quad (2)$$

From the above, the total number of the fuses for the redundancy fuses within the semiconductor memory becomes the sum of the above numbers (1) and (2).

A detailed example will be considered next.

It is assumed that, within the semiconductor memory, there exist sixteen banks that can be accessed simultaneously, and that one bank forms a relief block unit. It is also assumed that, within one bank, there exist 128 row decoders that can be specified by seven-bit addresses, and that one row decoder forms a relief unit. Further, it is assumed that four spare row decoders are provided within one bank.

In this case, according to the prior-art example (that is, only the fixed spare row decoders), M is equal to four, N is equal to seven, and S is equal to four.

The number of the spare row decoders is set to four for the following reason.

The number of the spare row decoders is determined based on the distribution of defective memory cells within a product to be developed. In other words, within the chip, the spare row decoders are provided by the number necessary for relieving the defective memory cells in order to improve the yield of the product to a satisfactory level.

However, it is difficult to accurately accept the distribution of defective memory cells at a design stage before actually manufacturing a product to be developed. This is because, in the absence of the product to be developed, it is not possible to obtain by inspection the distribution of defective memory cells of the product. In this case, there is no means other than to estimate a distribution of defective memory cells of the product to be developed, based on an inspection result (distribution of defective memory cells) of an already-developed product or other product manufactured by a similar or identical process.

Thus, in the present example, the distribution of defective memory cells within the semiconductor memory chip is assumed as follows based on an inspection result (distribution of defective memory cells) of an already-developed product or other product manufactured by a similar or identical process. It is assumed that, in each bank, the number of row decoders (including defective memory cells)that are to be replaced with the redundancy row decoders becomes two or less in most cases, three in some cases, four in a rare case, and five or above in a seldom case, respectively.

In this case, when two spare row decoders are provided within one bank, and when there arises a situation that three or more row decoders must be replaced with redundancy spare row decoders in this bank, for example, it is not possible to relieve all of these row decoders. Further, when three spare row decoders are provided within one bank, and when there arises a situation that four or more row decoders must be replaced with redundancy spare row decoders in this bank, for example, it is not possible to relieve all of these row decoders either.

In other words, according to the present example, it is assumed that it is very seldom that five or more row decoders are to be replaced with redundancy spare row decoders. Therefore, it is possible to obtain a sufficient yield when the number of spare row decoders within one bank is set to four.

Accordingly, it is assumed that the number of spare row decoders within one bank is set to four.

When the number of spare row decoders within one bank is set to four, there are provided sixty-four (=4×16 banks) spare row decoders in total within the semiconductor memory (chip).

However, not all the sixteen banks require three or four spare row decoders, but only a few of the sixteen banks require three or four spare row decoders. In other words, the distribution of defective memory cells within the semiconductor memory (chip) is deviated in many cases. Two spare row decoders are sufficient in most of the banks, and three or four spare row decoders are necessary in only a few banks.

However, it is difficult to specify these few banks. Therefore, according to the prior-art example, it has been necessary to dispose four spare row decoders in each bank. In other words, according to the conventional practice, in order to obtain a sufficient yield, it has been necessary to provide sixty-four spare row decoders and sixty-four spare fuses in total respectively within the semiconductor memory.

As explained above, conventionally, it has been necessary to provide four spare row decoders (spare fuse sets) in each bank, that is, sixty-four spare row decoders (spare fuses) in total. Despite this arrangement, it has been very seldom that all the sixty-four spare row decoders (spare fuse sets) are used. There remain many unnecessary spare row decoders (spare fuse sets) that are not used.

It is then assumed that the number of row decoders to be replaced with the spare row decoders is forty or less as a whole in the semiconductor memory (chip). In other words, it is assumed that it is possible to obtain a sufficient product yield when forty spare row decoders exist within the semiconductor memory.

However, although the distribution of defective memory cells within the chip is deviated as described above, it is not possible to estimate in which bank many defective memory cells occur. Further, in the case of simultaneously accessing a plurality of banks, it is necessary to replace the row decoders including the defective memory cells with the spare row decoders within the same bank to which the row decoders exist.

Accordingly, even if the number of row decoders to be replaced is forty or less, it has conventionally been necessary to dispose four spare row decoders and four spare fuse sets in each bank respectively.

The total number of fuses required within the chip according to the conventional practice will be calculated.

The total number of fuses within one fixed fuse set is N+1. In the preset example, as N is equal to seven, the number of fuses within one fixed fuse set is eight. Further, as $S \times 2^M$ fixed fuse sets are provided in total within the semiconductor memory, the total number of the fuses within the chip becomes $(N+1) \times S \times 2^M$. In the present example, as N is equal to seven, s is equal to four, and M is equal to four, the total number of fuses within the chip becomes 512 (=8×4×16).

According to the present invention, S (=4) spare row decoders are provided within each bank as is the case with the prior-art example. However, according to the present invention, the number of S spare row decoders in each one bank is divided into S0 fixed spare row decoders and S1 mapping spare row decoders. In this case, the number of the fixed fuse sets is assumed as S0, and the number of the mapping fuse sets is assumed as L.

For example, it is assumed that S0 is equal to two, and S1 is equal to two.

Now, the total number of fuses within the chip will be calculated.

The total number of fuses within one fixed fuse set is N+1. In the preset example, as N is equal to seven, the number of fuses within one fixed fuse set is eight. Further, as $S0 \times 2^M$ fixed fuse sets are provided in total within the semiconductor memory, the total number of fuses for the fixed fuse sets within the chip becomes $(N+1) \times S0 \times 2^M$. In the present example, as N is equal to seven, S is equal to four, and M is equal to four, the total number of fuses to be used for the fixed fuse sets within the chip becomes 256 (=8×2×16).

Further, the number of fuses within one mapping fuse set is (1+N+M+log [S1]/log [2]). As N is equal to seven, M is equal to four, and S1 is equal to two, the number of fuses within one mapping fuse becomes thirteen (=1+7+4+1). Further, as the L mapping fuse sets are provided within the semiconductor memory, the total number of fuses to be used for the mapping fuse sets within the chip becomes 13×L.

In the present invention, it is assumed that the number of row decoders to be replaced is not more than forty within the semiconductor memory. In other words, out of the forty row decoders, thirty-two row decoders (=2×16 banks) can be relieved by the above-described fixed spare row decoders. Thus, it is possible to achieve a sufficient yield when the mapping spare row decoders can relieve the remaining eight row decoders.

Accordingly, it is sufficient that the number of L is equal to eight. Thus, the total number of fuses for the mapping fuse sets within the chip becomes 104 (=13×8).

From the above, the total number of fuses within the chip becomes 360 according to the present invention. This is the sum of the total number (256) of fuses for the fixed fuse sets and the total number (104) of fuses for the mapping fuse sets.

In the case of providing only the conventional fixed spare row decoders, the total number of fuses within the semiconductor memory is 512, as described above. Therefore, according to the present invention, it is possible to decrease the number of fuses by 152 (=512−360) from the conventionally required number of fuses.

Further, according to the present invention, the product yield is not lowered even if the number of fuses is decreased. In other words, most of the banks have high probability that the row decoders are to be replaced with two or less spare row decoders. Therefore, it is possible to relieve these two or less row decoders by replacing these row decoders with the two fixed spare row decoders provided in each bank. Further, when it has become necessary to replace three or more row decoders in a few banks, it is possible to replace two row decoders with the fixed spare row decoders and to replace the rest of the row decoders with the mapping spare row decoders.

More specifically, in the above example, thirty-two fixed fuse sets and eight mapping fuse sets are provided within the semiconductor memory (chip). Further, forty row decoders can be replaced with the spare row decoders. Accordingly, when there arises a situation where two or less row decoders (defective row decoders) have to be replaced with redundancy row decoders in each bank, it is possible to relieve these row decoders with high security. Further, when J (J is a natural number) banks have three or four defective row decoders, these defective row decoders can be replaced with the mapping spare row decoders, if the total number of the defective row decoders within the J banks minus (J×2) is eight or smaller.

In the present example, when five or more defective row decoders exist within one bank, it is not possible to relieve all of the five row decoders. However, in the present example, it is very seldom that five or more defective row decoders occur within one bank. Even when five or more defective row decoder exist within one bank, the impossibility of relieving all of these defective row decoders is not a problem, as it is possible to obtain a sufficient product yield.

As described above, according to the present invention, in the semiconductor memory having $2^M$ banks (relief block unit) and $2^N$ row decoders (relief unit), S0 and S1 are set to optimum values in advance based on the distribution of defective memory cells of the chip for obtaining a sufficiently high yield. Therefore, it is possible to achieve a high product yield with a smaller number of fuses.

According to the present invention, the fixed spare row decoders and the mapping spare row decoders are used in combination. Further, most of the defective row decoders can be replaced with the fixed spare row decoders, and the remaining few defective row decoders can be replaced with the mapping spare row decoders.

In other words, when an approximate total number of row decoders to be replaced with redundancy row decoders within the semiconductor memory is known in advance, a predetermined number (S0) of fixed spare row decoders are disposed within each bank (however, $S0 \times 2^M$ does not exceed the total number of row decoders to be replaced), and the spare row decoders that cannot be replaced with the fixed spare row decoders can be replaced with the mapping spare row decoders.

The number (S1) of the mapping spare row decoders within each bank is set to a value of a maximum number of row decoders to be replaced within one bank (a number which ensures a sufficient product yield when the defective row decoders are relieved by this number) minus the number (S0) of the fixed spare row decoders within each bank.

Further, the number (L) of the mapping fuse sets is set to a value of the total number of row decoders to be replaced within the semiconductor memory minus the total number ($S0 \times 2^M$) of fixed spare row decoders within the semiconductor memory. Usually, the number (L) of the mapping fuse sets is smaller than the number (S1) of the mapping spare row decoders, as shown in the above-described example.

Therefore, according to the present invention, it is possible to decrease the number of fuses within the semiconductor memory (chip) while securing a sufficiently high product yield. Further, it is also possible to decrease the size of the chip area, which leads to a reduction in the cost of the semiconductor memory.

As a technique close to the present invention, there may be considered a case that only the mapping spare row decoders are provided within each bank of the semiconductor memory (chip) without providing the fixed spare row decoders.

However, according to the technique of disposing only the mapping spare row decoders within each bank of the semiconductor memory, the effect of decreasing the number of fuses becomes less satisfactory than the effect of the prior-art technique, if it is conditional to secure a sufficiently high product yield. The effect of this technique is naturally less than the effect of the present invention.

Thus, the present invention has the significance in the point of providing both the fixed spare row decoders and the mapping spare row decoders within each bank of the semiconductor memory.

Detailed numerical values will be considered next.

It is assumed that, like the above-described example, a semiconductor memory has sixteen banks (relief block unit) and each bank has 128 row decoders (relief unit). It is also assumed that forty row decoders are to be replaced in total with redundancy row decoders in the semiconductor memory. Further, it is assumed that other conditions are also the same as those of the above-described example. For example, the number of the spare row decoders within the bank for obtaining a sufficient product yield is the same as that of the above-described example.

In this case, four mapping spare row decoders are disposed in each bank. The total number of mapping fuse sets becomes forty. In other words, M is equal to four, N is equal to seven, S0 is equal to 0, S1 is equal to four, and L is equal to forty.

Then, the total number of fuses for the mapping fuse sets within the semiconductor memory is expressed as $(1+N+M+\log[S1]/\log[2]) \times L$ as described above. In other words, the total number of fuses for the mapping fuse sets within the semiconductor memory becomes $560 (=[1+7+4+2] \times 40)$.

The total number of the fuses within the semiconductor memory in the present invention is 360, and the total number of the fuses within the semiconductor memory in the prior-art example is 512. Therefore, it can be understood from the above that when only the mapping spare row decoders are used, the total number of the fuses in the semiconductor memory becomes larger than the above two numbers.

Based on this technique, when the total number of the fuses in the semiconductor memory is set to the same number as that of the present invention, for example, the number becomes, 364 as follows. Fourteen (14) (the number of fuses within one mapping fuse set)×26 (the number of mapping fuse sets)=364. This means that only twenty-six row decoders can be replaced in total in the semiconductor memory. This number does not ensure a sufficiently high product yield.

In the above-described first and second examples of the semiconductor memory according to the present invention, the fuse sets (fuse elements) are used as the fail address memories. However, the fail address memories may be structured by any other materials than the above so long as they are non-volatile. For example, it is also possible to structure the fail address memories with transistors like PROM, EPROM or EEPROM.

Further, as explained above, according to the semiconductor memory of the present invention, fixed spare row decoders and mapping spare row decoders are provided respectively in each bank (or sub-array) of the semiconductor memory.

In the cases of FIGS. 5 and 11, for example, four spare row decoders in total including two fixed spare row decoders and two mapping spare row decoders are provided in each of the eight banks respectively. Thus, thirty-two spare row decoders are disposed in total in the semiconductor memory.

On the other hand, two fixed fuse sets are provided corresponding to the fixed spare row decoders in each bank. Thus, sixteen fixed fuse sets are provided in total in the semiconductor memory. Further, only eight mapping fuse sets are provided within the semiconductor memory. In other words, when it is conditional to obtain a sufficiently high product yield, according to the prior-art technique, it is necessary to provide thirty-two fixed fuse sets corresponding to the fixed spare row decoders. However, according to the present invention, only twenty-four (=16+8) fuse sets (fixed fuse sets and mapping fuse sets) may be provided.

According to the present invention, each fuse within the mapping fuse set stores mapping data for showing the correspondence of this fuse set to a specific one of the mapping spare row decoders within a specific bank. Therefore, the number of fuses within one mapping fuse set is larger than the number of fuses within one fixed fuse set. However, the total number of the fuses within the semiconductor memory (chip) can be set smaller than that of the prior-art example.

Further, according to the present invention, when the distribution of defective memory cells within the semiconductor memory is uniform, the defective memory cells can be replace with the fixed spare row decoders and the fixed fuse sets. On the other hand, when the distribution of the defective memory cells within the semiconductor memory is deviated, all the defective memory cells can be relieved by mapping (corresponding) the mapping fuse sets to the mapping spare row decoders within a predetermined bank based on the mapping data. Therefore, the invention makes it possible to replace the defective row decoders with the spare row decoders with high degree of freedom.

As explained above, according to the present invention, it is possible to increase the relief efficiency to a high level by using the fail address memories (fuses, for example) of small memory capacity, which leads to a reduction in the chip area and a reduction in the manufacturing cost.

The explanations of the above embodiments refer to the case where the row decoder is replaced by the spare row decoder. However, the present invention can be also applied to the case where the column decoder is replaced by the spare column decoder. In this case, the fixed spare column decoder and the mapping spare column decoder are arranged adjacent to the normal column decoder. Furthermore, the fixed fuse set is provided in association with the fixed spare column decoder, and the mapping fuse set is associated with the mapping spare column decoder in accordance with the mapping data stored in the mapping fuse set.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor memory device comprising:
   a memory cell array having memory cells arranged in columns and rows;
   a plurality of normal decoders; and
   a redundancy system for replacing a defective memory cell included in said memory cell array, said redundancy system comprising
   a plurality of fixed spare decoders for replacing said normal decoders;
   a plurality of fixed storage circuits each for storing a fail address assigned to said defective memory cell, said fixed storage circuits disposed in association with said fixed spare decoders respectively;
   a plurality of mapping spare decoders for replacing said normal decoders; and
   a plurality of mapping storage circuits each for storing the fail address assigned to said defective memory cell and storing mapping information indicative of a relationship with said mapping spare decoders, said mapping storage circuits disposed independent of said mapping spare decoders;
   wherein said normal decoder is replaced with said fixed spare decoder when the fail address assigned to said defective memory cell is registered in said fixed storage circuit, and said normal decoder is replaced with said mapping spare decoder when the fail address assigned to said defective memory cell is registered in said mapping storage circuit.

2. The semiconductor memory device according to claim 1, wherein each of said fixed spare decoders and said mapping spare decoders is connected to n (n is an integer greater than 1) spare word lines respectively, when each of said normal decoders is connected to n word lines.

3. The semiconductor memory device according to claim 1, wherein a number of said mapping storage circuits is less than a number of said mapping spare decoders.

4. The semiconductor memory device according to claim 1, wherein said mapping storage circuits each outputs a replacement control signal when the fail address assigned to said defective memory cell stored therein matches an input address.

5. The semiconductor memory according to claim 4, wherein said mapping storage circuits each comprises:
   an address designating fuse circuit for storing the fail address assigned to said defective memory cell;
   a mapping fuse circuit for storing the mapping information which indicates the relationship with said mapping spare decoders;
   an address match detecting circuit for detecting whether the fail address stored in said address designating fuse circuit matches the input address; and
   a decoder for decoding an output signal of said mapping fuse circuit when said address match detecting circuit has output a signal indicating that the fail address matches the input address, thereby creating said replacement control signal.

6. The semiconductor memory device according to claim 5, wherein said fixed storage circuits and said mapping storage circuits are structured by nonvolatile memories respectively.

7. A semiconductor memory device comprising:
   a first memory cell array having memory cells arranged in columns and rows, said first memory cell array included in a first bank;
   a second memory cell array having memory cells arranged in columns and rows, said second memory cell array included in a second bank;
   a plurality of first normal decoders included in said first bank;
   a plurality of second normal decoders included in said second bank; and
   a redundancy system for replacing a first defective memory cell included in said first memory cell array and a second defective memory cell included in said second memory cell array, said redundancy system comprising
   a plurality of first fixed spare decoders for replacing said first normal decoders;
   a plurality of first fixed storage circuits each for storing a first fail address assigned to said first defective memory cell, said first fixed storage circuits disposed in association with said first fixed spare decoders respectively.
   a plurality of second fixed spare decoders for replacing said second normal decoders;
   a plurality of second fixed storage circuits each for storing a second fail address assigned to said second defective memory cell, said second fixed storage circuits disposed in association with said fixed spare decoders;
   a plurality of first mapping spare decoders for replacing said first normal decoders;
   a plurality of second mapping spare decoders for replacing said second normal decoders; and
   a plurality of mapping storage circuits each for storing a fail address assigned to said first defective memory cell or said second defective memory cell, said mapping storage circuits disposed independent of said first mapping spare decoders and said second mapping spare decoders, said mapping storage circuits utilized for effecting replacement of any one of said first normal decoders and said second normal decoders.

8. The semiconductor memory device according to claim 7, wherein said mapping storage circuits store mapping information indicative of a relationship with said first mapping spare decoders and said second mapping spare decoders.

9. The semiconductor memory device according to claim 7, wherein said mapping storage circuits each outputs a replacement control signal when the fail address stored therein matches an input address.

10. The semiconductor memory device according to claim 9, wherein said mapping storage circuits each comprises:
    an address designating fuse circuit for storing the fail address;
    a fuse circuit for storing mapping information which indicates a relationship with said first mapping spare decoders and said second spare decoders;
    an address match detecting circuit for detecting whether the fail address stored in said address designating fuse circuit matches the input address; and
    a decoder for decoding an output signal of said fuse circuit when said address match detecting circuit has output a signal indicating that the fail address matches the input address, thereby creating the replacement control signal.

11. The semiconductor memory device according to claim 10, wherein said first and second fixed storage circuits and said mapping storage circuits are structured by nonvolatile memories respectively.

12. The semiconductor memory device according to claim 11, wherein said first and second banks are accessed substantially simultaneously at the time of a write/read operation.

13. The semiconductor memory device according to claim 8, wherein said mapping storage circuits each comprises:
- a specification decoder for specifying one of said first bank and said second bank, and for specifying one of said first mapping spare decoders and said second mapping spare decoders based on the mapping information; and
- a fail address coincidence detector for comparing an input address with the fail address, and activating said specification decoder when both addresses coincide with each other.

14. The semiconductor memory device according to claim 13, wherein said specifying decoder is connected to said first bank and said second bank by first and second signal lines and activates one of said first and second signal lines based on the mapping information.

15. The semiconductor memory device according to claim 8, wherein said mapping storage circuits each comprises:
- a specification decoder for specifying one of said first bank and said second bank based on the mapping information:
  - a fail address coincide detector for comparing an input address with the fail address, and activating said specification decoder when both addresses coincide with each other; and
- a logic circuit for specifying one of said first mapping spare decoders and said second mapping spare decoders based on the mapping information.

16. The semiconductor memory device according to claim 15, wherein said specification decoder is connected to said first bank and said second bank by first and second signal lines and activates one of said first and second signal lines based on the mapping information.

17. A semiconductor memory device comprising:
- a memory cell array having memory cells arranged in columns and rows, said memory cell array divided into a plurality of memory banks;
- a plurality of normal decoders; and
- a redundancy system for replacing a defective memory cell included in said memory cell array, said redundancy system comprising
  - a plurality of fixed spare decoders for replacing said normal decoders;
  - a plurality of fixed storage circuits each for storing a fail address assigned to said defective memory cell, said fixed storage circuits disposed in association with said fixed spare decoders respectively;
  - a plurality of mapping spare decoders for replacing said normal decoders; and
  - a plurality of mapping storage circuits each for storing a fail address assigned to said defective memory cell and storing mapping information indicative of a relationship with said mapping spare decoders, said mapping storage circuits disposed independent of said mapping spare decoders;
    - wherein said mapping storage circuits replace said normal decoders included in any one of said banks with said mapping spare decoders in accordance with the mapping information.

18. The semiconductor memory device according to claim 17, wherein said mapping storage circuits each outputs a replacement control signal when the fail address stored therein matches an input address.

19. The semiconductor memory device according to claim 18, wherein said mapping storage circuits each comprises:
- an address designating fuse circuit for storing the fail address assigned to said defective memory cell;
- a fuse circuit for storing the mapping information which indicates the relationship with said mapping spare decoders;
- an address match detecting circuit for detecting whether the fail address stored in said addressed designating fuse circuit matches the input address; and
- a decoder for decoding an output signal of said fuse circuit when said address match detecting circuit has output a signal indicating that the fail address matches the input address, thereby creating the creating the replacement control signal.

20. The semiconductor memory device according to claim 19, wherein said mapping storage circuits each stores bank data for specifying any one of said banks.

21. The semiconductor memory device according to claim 20, wherein said fixed storage circuits and said mapping storage circuits are structured by nonvolatile memories respectively.

22. The semiconductor memory device according to claim 21, wherein said banks are accessed substantially simultaneously at the time of a write/read operation.

23. The semiconductor memory device according to claim 17, wherein said mapping storage circuits each comprises:
- a specification decoder for specifying one of said plurality of banks, and for specifying one of said mapping spare decoders based on the mapping information; and
- a fail address coincidence detector for comparing an input address with the fail address, and activating said specification decoder when both addresses coincide with each other.

24. The semiconductor memory device according to claim 23, wherein said specification decoder is connected to said plurality of banks by a plurality of signal lines and activates one of said plurality of signal lines connected to one bank specified by the mapping information.

25. The semiconductor memory device according to claim 17, wherein said mapping storage circuits each comprises:
- a specification decoder for specifying one of said plurality of banks based on the mapping information;
- a fail address coincidence detector for comparing an input address with the fail address, and activating said specification decoder when both addresses coincide with each other; and
- a logic circuit for specifying one of said plurality of mapping spare decoders based on the mapping information.

26. The semiconductor memory device according to claim 25, wherein said specification decoder is connected to said plurality of banks by a plurality of signal lines and activates one of said plurality of signal lines connected to one bank specified by the mapping information.

* * * * *